US008205185B2

(12) United States Patent
Su et al.

(10) Patent No.: US 8,205,185 B2
(45) Date of Patent: Jun. 19, 2012

(54) FAST EVALUATION OF AVERAGE CRITICAL AREA FOR IC LAYOUTS

(75) Inventors: Qing Su, Sunnyvale, CA (US); Subarnarekha Sinha, Foster City, CA (US); Charles C. Chiang, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 376 days.

(21) Appl. No.: 12/542,625

(22) Filed: Aug. 17, 2009

(65) Prior Publication Data

US 2009/0307641 A1    Dec. 10, 2009

Related U.S. Application Data

(62) Division of application No. 12/032,313, filed on Feb. 15, 2008, now Pat. No. 7,962,882, which is a division of application No. 10/978,946, filed on Nov. 1, 2004, now Pat. No. 7,346,865.

(51) Int. Cl.
*G06F 17/50* (2006.01)

(52) U.S. Cl. .......................................... 716/132; 716/135

(58) Field of Classification Search .................... 716/52, 716/54, 55, 56, 126, 129, 130, 132, 135
See application file for complete search history.

(56) References Cited

U.S. PATENT DOCUMENTS

| 3,983,479 | A | 9/1976 | Lee et al. |
| 6,691,293 | B2 | 2/2004 | Kanazawa |
| 6,732,002 | B1 * | 5/2004 | Weiner et al. ................ 700/110 |
| 6,751,519 | B1 | 6/2004 | Satya et al. |
| 7,543,255 | B2 | 6/2009 | Sinha et al. |
| 2008/0148196 | A1 | 6/2008 | Su et al. |
| 2008/0216028 | A1 | 9/2008 | Su et al. |

OTHER PUBLICATIONS

I. Bubel, W. Maly, T. Waas, P. K. Nag, H. Hartmann, D. Schmitt-Landsiedel, and S. Griep. AFFCCA: A tool for critical area analysis with circular defects and lithography deformed layout. In IEEE International Workshop on Defect and Fault Tolerance in VLSI Systems, 1995.
Ulrich Lauther. An o(nlogn) algorithm for boolean mask operations. In Design Automation Conference, 1981.
G. A. Allan and A. J. Walton. Efficient extra material critical area algorithms. IEEE Transactions on Computer-Aided Design of Integrated Circuits and Systems, 18(10):1480-1486, 1999.
S. Fitzpatrick, G. O'Donoghue, and G. Cheek. A comparison of critical area analysis tools. In IEEE/SEMI advanced semiconductor manufacturing conference, 1998.
G. A. Allan. A comparison of efficient dot throwing and shape shifting extra material critical area estimation. In IEEE Symposium of Defect and Fault Tolerance in VLSI Systems, 1998.

(Continued)

*Primary Examiner* — Vuthe Siek
(74) *Attorney, Agent, or Firm* — Haynes Beffel & Wolfeld LLP; Warren S. Wolfeld

(57) ABSTRACT

Method and apparatus for approximating the average critical area of a layout or layout region, involving summing, over all the object segments of interest, respective critical area contribution values that are dependent upon particular layout parameters of the objects, each of the contribution values being representative of a plurality of defect sizes, and being defined such that for each defect size in the plurality of defect sizes, and for a particular defect type, the contribution values collectively count all critical areas arising due to the object segments of interest only once.

14 Claims, 15 Drawing Sheets

OTHER PUBLICATIONS

P. K. Nag and W. Maly. Hierarchical extraction of critical area for shorts in very large Ics. In IEEE International Workshop on Defect and Fault Tolerance in VLSI Systems, 1995.

W. A. Pleskacz, C. H. Ouyang, and W. Maly. A DRC-based algorithm for extraction of critical areas for opens in large VLSI circuits. IEEE Transactions on Computer-Aided Design of Integrated Circuits and Systems, 18(2):151-162, 1999.

Alexander R. Dalal, Paul D. Franzon, and Michael J. Lorenzetti. A layout-driven yield predictor and fault generator for VLSI. IEEE Transactions on Semiconductor Manufacturing, 7(1):77-82, 1993.

Marko Chew and Andrzej J. Strojwas. Efficient circuit re-extraction for yield simulation application. In International Conference on Computer-Aided Design, 1987.

Y. Hamamura, K. Nemoto, T. Kumazawa, and H. Iwata. Repair yielf simulation with iterative critical area analysis for different types of failure. In IEEE Symposium on Defect and Fault Tolerance in VLSI Systems, 2002.

Way Kuo and Taeho Kim. An overview of manufacturing yield and reliability modeling for semiconductor products. preceedings of IEEE, 87(8)1329-1344, 1999.

James A. Cunningham. the use and evaluation of yielf models in integrated circuit manufacturing. IEEE Transactions on Semiconductor Manufacturing, 3(2):61-70, 1990.

W. Maly, H. Heineken, J. Khare, and P. K. Nag. Design for manufacturability in submicron domain. In International Conference on Computer-Aided Design, 1996.

Yanwen Fei and Paul Simon and Wojciech Maly. New yield models for DSM manufacturing. In International Electron Devices Meeting (IEDM), 2000.

D. M. H. Walker. Critical area analysis. In 4th International Conference on Wafer Scale Integration, 1992.

A. V. Ferris-Prabhu. Modeling the critical area in yield forecasts. IEEE Journal of Solid-State Circuits, SC-20 (4):874-878, 1985.

A. V. Ferris-Prabhu. Defect size variations and their effect on the critical area of VLSI devices. IEEE Journal of Solid-State Circuits, SC-20(4):878-880, 1985.

Ed P. Huijbregts, Hua Xue, and Jochen A. G. Jess. Routing for reliable manufacturing. IEEE Transactions on Semiconductor Manufacturing, 8(2):188-194, 1995.

Venkat K. R. Chiluvuri and Israel Koren. Layout-synthesis techniques for yield enhancement. IEEE Transactions on Semiconductor Manufacturing, 8(2):178-187, 1995.

Gerard A. Allan, Anthony J. Walton, and Robert J. Holwill. An yield improvement technique for IC layout using local design rules. IEEE Transactions on Computer-Aided Design of Integrated Circuits and Systems, 11(11):1355-1362, 1992.

Venkat K. R. Chiluvuri and Israel Koren. New routing and compaction strategies for yield enhancement. In IEEE International Workshop on Defect and Fault Tolerance in VLSI Systems, 1992.

J. Fang, J. S. K. Wong, K. Zhang, and P. Tang. A new fast constraint graph generation algorithm for VLSI layout compaction. In IEEE International Symposium on Circuits and Systems, 1991.

Udi Manber. Introduction to Algorithms A Creative Approach. Addison-Wesley Publishing Company Inc., 1989.

Restriction Requirement mailed by the USPTO on Dec. 8, 2006 in U.S. Appl. No. 10/978,946.

Applicants' Jan. 11, 2007 Response A to Restriction Requirement mailed by the USPTO on Dec. 8, 2006 in U.S. Appl. No. 10/978,946.

* cited by examiner

FAST EVALUATION OF AVERAGE CRITICAL AREA FOR IC LAYOUTS

RELATED APPLICATIONS

This is a Divisional of U.S. patent application Ser. No. 12/032,313, filed Feb. 15, 2008, which is a Divisional of U.S. patent application Ser. No. 10/978,946, filed Nov. 1, 2004, now U.S. Pat. No. 7,346,865. Both ancestor patent applications are assigned to the assignee of the present application and are incorporated by reference herein.

BACKGROUND

1. Field of the Invention

The invention relates to integrated circuit fabrication, and more particularly to methods for determining the average critical area of a particular layout.

2. Description of Related Art

As VLSI technology moves to deep submicron, manufacturability and yield related issues become increasingly important. Yield loss can be caused by many factors. One important factor is random defect yield loss, which is related to the yield loss caused by contamination particles. The design related parameter required for modeling random defect yield is sometimes called the critical area.

Critical Area measures a design's sensitivity to the random particle defects. Much work has been done on extracting and calculating the critical area for a given design layout. The main approaches fall into the two main categories: Shape Expansion based methods and Monte Carlo methods. Conventional shape expansion based methods generally attempt to calculate the critical area contributed by each object and for each particular defect size of interest. For each defect size, the method approximates the geographic union of the critical area contributions of all the objects. The result is then averaged over all the defect sizes, weighted by the defect size distribution.

One problem with the conventional shape expansion methods is that calculation of a geographic union can be extremely time consuming. Some methods approximate the geographic union, but only at the expense of accuracy. Other methods do not even attempt to approximate the geographic union, and simply add all the critical area contributions together. The latter variation creates significant inaccuracies because overlapping regions are counted twice or more: once for each object that includes the region in its critical area contribution. Many conventional shape expansion methods also suffer because they require a separate critical area calculation for each defect size of interest. Because each critical area calculation is so expensive, the number of discrete defect sizes for which it is calculated is often reduced, thereby degrading accuracy of the results. If accuracy is to be improved by increasing the number of discrete defect sizes at which the critical area calculation is made, then runtimes can easily become prohibitive. Another problem with conventional shape expansion methods is that there is no explicit formula available for total critical area. Thus it cannot be used to evaluate critical area as part of cost function for layout optimization.

In Monte Carlo based methods, a generator generates random defects with their sizes following the given defect size distribution function. Since the Monte Carlo based methods do not need to limit themselves to any specific defect size, they do not suffer from accuracy degradation due to insufficient numbers of defect sizes tested. But accurate estimation may still require huge runtimes due to the need to test huge numbers of randomly generated defects.

Embodiments of the present invention can avoid the above problems and others by deriving an explicit formula for a weighted average "pseudo-critical area" contributed by each object in the layout region under study. Preferably the weighted average pseudo-critical areas depend only on parameters of the layout, all of which can be extracted during a single sweep through the objects in the region. The weighted average pseudo-critical area preferably already accounts for all defect sizes of interest, so it is not specific to any individual defect size. It is therefore unnecessary to perform the calculation separately for each of many defect sizes. The weighted average pseudo-critical area preferably is defined also such that regions that might, under conventional definitions, be included in the critical area contributed by more than one object, are allocated to such objects in a non-overlapping manner. Calculating the geographic union of the weighted average pseudo-critical areas in such an embodiment therefore can be as simple as summing them. The final result for total weighted average critical area can be another explicit formula, as a function of layout parameters only.

BRIEF DESCRIPTION OF THE DRAWINGS

The invention will be described with respect to specific embodiments thereof, and reference will be made to the drawings, in which.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
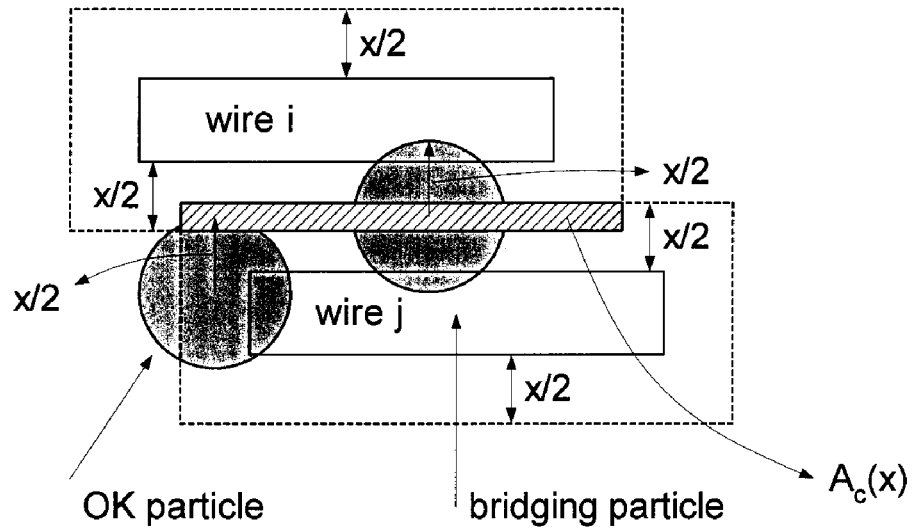
FIGS. 1, 2, 5, 6 and 18 illustrate critical area regions arising due to wires on a layout.
Figure 2:
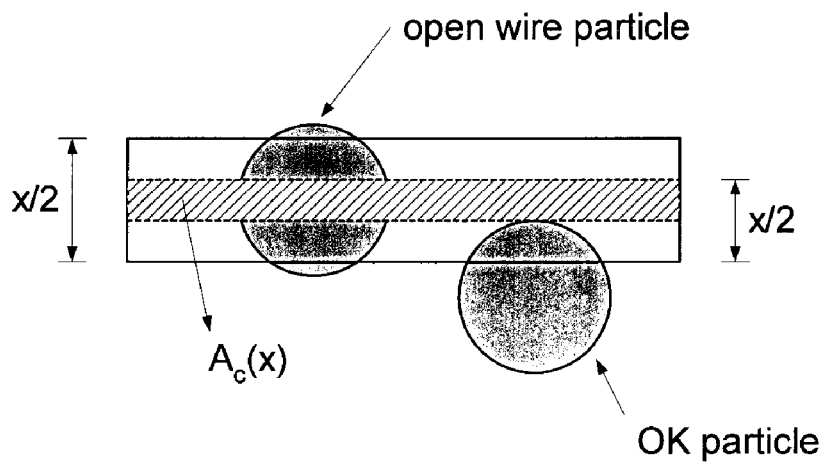

The critical area $A_c$ is defined as the total area of the regions on the layout where the contamination particles must fall to cause functional failures (such as open and short circuit failures). For purposes of the present discussion, contamination particles are approximated as discs, and the location of the centerpoint is considered to be the location of the particle. Other conventions will produce the same or similar results. FIGS. 1 and 2 illustrate conventional shape expansion methods for the extraction of the short and open critical areas caused by the particles with radius x/2, or size x (shown as shaded areas). Once the critical areas for all the wires are computed, the geometric union of these areas gives the total critical area $A_c(x)$ at the defect size x. The "weighted average critical area" is the average over a number or range of defect sizes of the critical area. The weighted average critical area $A_{cr}$ is calculated as $$A_{cr} = \int_{x_{min}}^{x_{max}} A_c(x) f(x) dx, \quad (1)$$

where $x_{min}$ and $x_{max}$ are the minimal and maximal defect sizes in a range of defect sizes, and f(x) is the defect size distribution function.

As is well know, the arithmetic average over a certain number of values is the summation of these values divided by the total number of the values. Equation (1) is a weighted average value. This means that each participating value's contribution to the sum is weighted with some weighting function. The weighted average value is the weighted sum divided by the total contribution of all the participating values. In equation (1), the weighting function is the defect size distribution function. If the weighting function for all participating values is equal, then the weighted average is the same as the arithmetic average, and this is considered herein to be a special case of the term "weighted average". One basic property of a probability distribution function is that the sum of all the distribution function values over all the possible defect sizes is equal to one. Mathematically, $\int f(x)dx=1$. Therefore the weighted average critical area $A_{cr}$ in (1) is equal to the weighted sum of the critical areas for every defect size $A_c(x)$ with the defect size distribution function as the weighting function. In the following content of this document, for simplicity of discussion, the term "weighted average" is sometimes abbreviated merely as "average".

Also as is well known, an average over a number or range of values differs from the sum of such values only by a scaling factor. That is, an average over such values is calculated by summing the (optionally weighted) values and dividing the sum by a scaling factor given by either the number of values or their range. The scaling factor may be applied separately to the sum, or may be applied to the values (or their weighting factors) prior to the sum. In many situations, however, the scaling factor is ignored. For example, if the average will be used only in relation to other averages that have the same scaling factor, it is unnecessary to divide any of the sums by the scaling factor; one value will remain smaller or larger than another of the values whether or not they have all been divided by the scaling factor. As another example, if the scaling factor will become subsumed within a calibration factor that is determined empirically, it is unnecessary to apply it explicitly. It is sufficient instead to simply allow the empirical calibration to include the scaling factor's effects. It is common in these situations, therefore, for practitioners to use the terms "average" and "sum" interchangeably, even though mathematically speaking they are not the same in an absolute sense. That is, one may speak of calculating an average value, but the equations given for doing so merely calculate the sum; or vice-versa. Consistently with that practice, the two terms, "average" and "sum", are used interchangeably herein.

In order to calculate the average total critical area, the total critical area at each particular defect size, which is denoted as $A_c(x)$ in equation (1), is needed. It can be seen that at each particular defect size, the conventional shape expansion method typically computes the geometric union of the critical areas for all the wires to obtain the total critical area. Due to the existence of the overlaps between the critical areas of different wires, the total critical area is not a linear sum of each individual wire's critical area. Several algorithms (mostly based on scan-line or quad-tree data-structures) have been proposed for efficiently computing the geometric union. However, none of these methods can handle the geometric union analytically. Therefore there is no way to predict the total critical area at a different defect size. The whole extraction and computation procedure therefore has to be repeated for different defect sizes.

Figure 3:
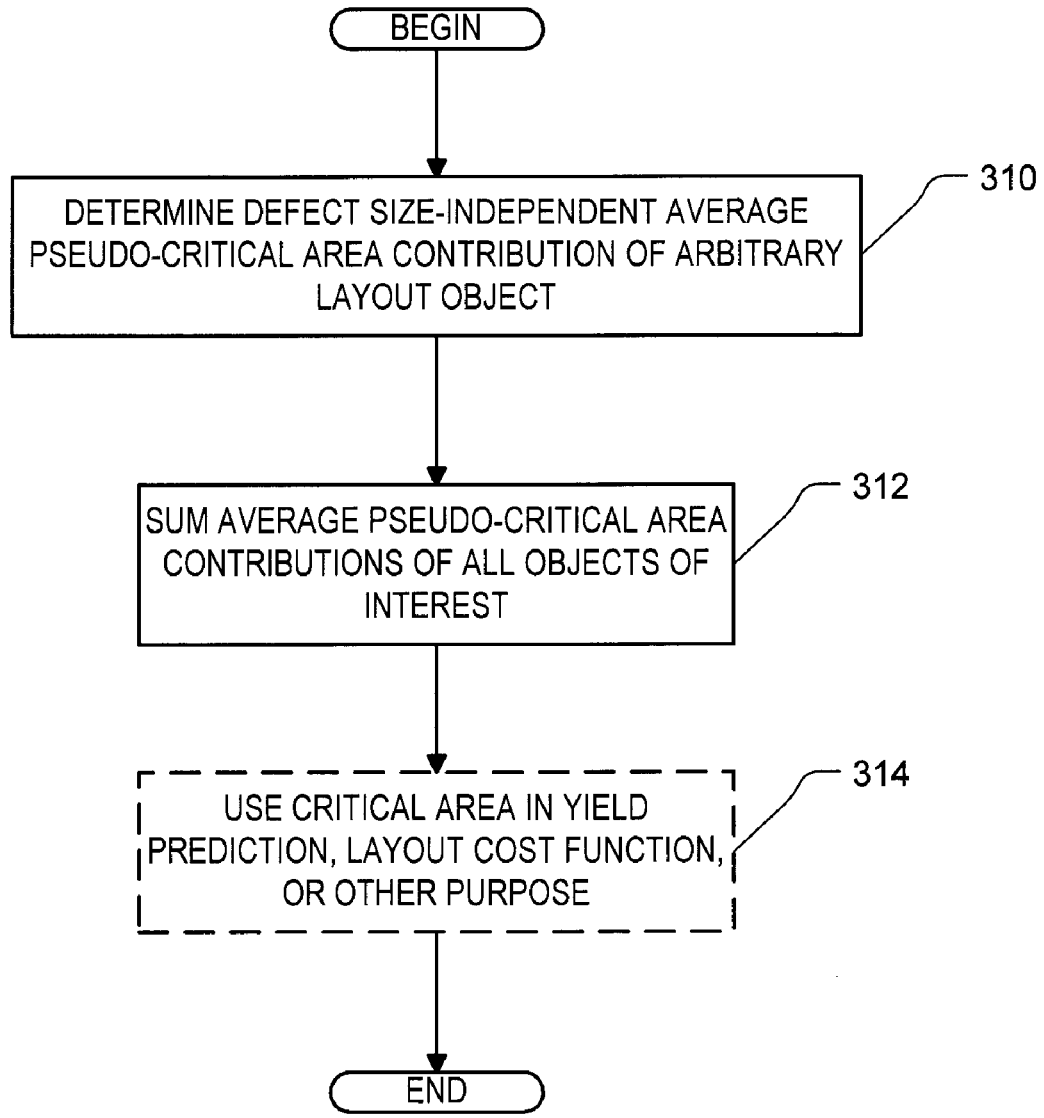
FIGS. 3, 4, 7, 8, 9, 11, 12, 14 and 17 are flowcharts illustrating methods according to the invention for calculating and using short and open average critical areas of a layout.
Figure 17:
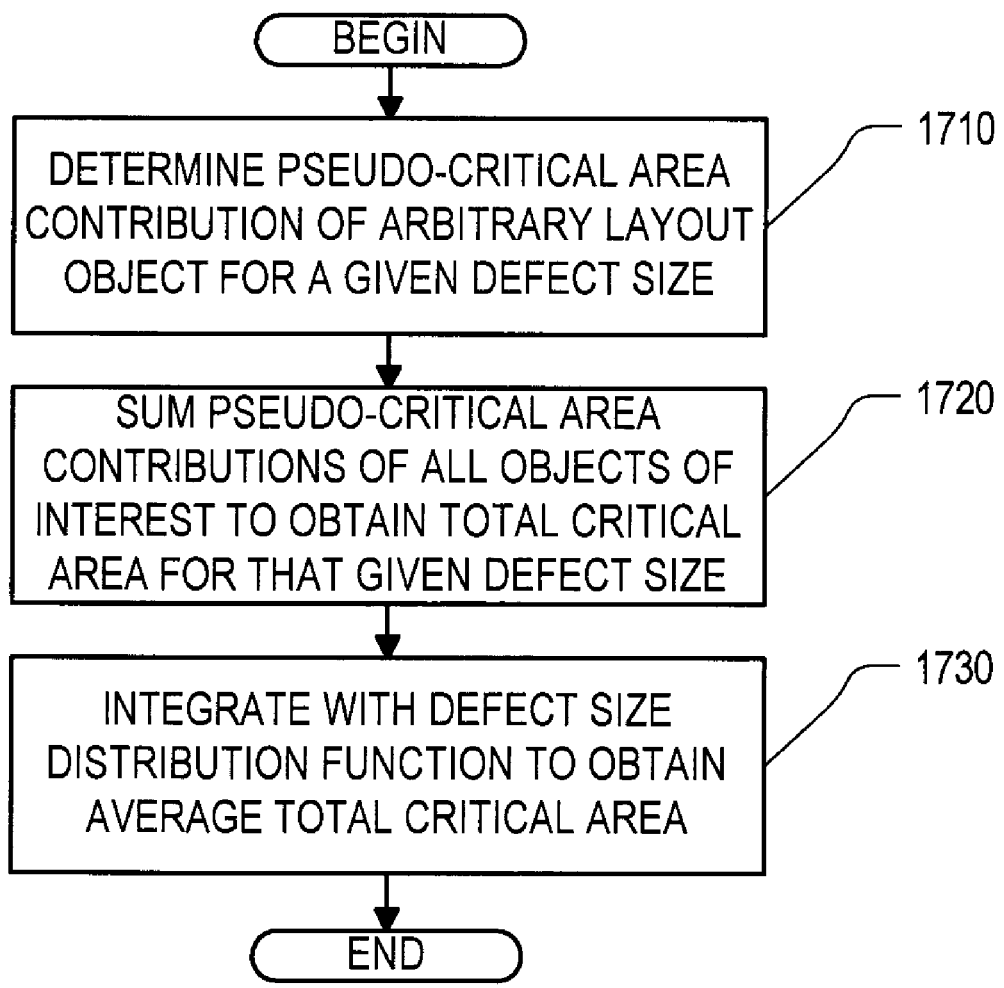

FIG. 17 illustrates the general concept for the derivation of an explicit formula for average total critical area. Step 1710 is to formulate the pseudo-critical area contribution of any arbitrary layout object for a given defect size. Since the pseudo-critical area is defined in such a way that the actual critical area regions arising due to more than one object are allocated among the pseudo-critical areas of these objects and any region in the actual critical area is included in one and only one pseudo-critical area, the total critical area will be a summation of all the pseudo-critical area contributions of all objects of interest. This is the operation performed in step 1720. Because step 1720 performs only a summation, the result obtained from that step is an explicit formula as well. Thus the integration in step 1730 can be performed analytically resulting in another explicit formula at the end of step 1730 for average total critical area. Since summation and integration are interchangeable, we can perform step 1730 immediately after step 1710, then at the end perform step 1720. FIG. 3 shows the flow sequence after swapping steps 1720 and 1730 in FIG. 17. In FIG. 3, the step 310 performs step 1710 followed by step 1730 in FIG. 17.

FIG. 3 illustrates the basic overall method for the use of an embodiment of the invention. Two major steps are involved. First, the method determines an "average pseudo-critical area" contribution function for an arbitrary object, a function that is already representative of all the defect sizes of interest. (As used herein, a value is considered herein to be "representative of" a plurality of underlying values if it takes into account all of such underlying values.) Second, the method then sums this function over all the objects of interest.

In particular, in step 310, an analytical defect size-independent average pseudo-critical area contribution function is developed for an arbitrary layout object. This function is already representative of all defect sizes of interest. It is based on, but is not the same as, the actual critical area contribution at each defect size. In particular, as set forth in more detail below, the average pseudo-critical area contribution function is defined so that critical area regions arising due to more than one object are allocated among the objects in such a way as to avoid overlaps. The average pseudo-critical area contribution function preferably does depend upon layout parameters of the objects under consideration, such as the spacing between objects, the width of the objects, and the portion of objects that are visible to neighboring objects. Certain prior art methods assume that all objects are spaced equally and have equal widths, a simplification that does not accord with actual practice and which can degrade the accuracy of the results. The average pseudo-critical area contribution function preferably does not depend upon any other parameters that vary as a function of defect size or for different ones of the objects under consideration.

In step 312, with the explicit formulae for short and open critical areas available, an embodiment need only to go through every objects in the layout once to extract the above layout parameters. At the end of extraction, the layout parameters are substituted into the formulae and the average pseudo-critical area contributions of all objects of interest are simply summed. Because of the way the average pseudo-critical area contribution function is defined for purposes of step 310, this simple summation is equivalent to a geographic union. Step 312 results in a critical area value arising from all the objects of interest in the layout, already averaged over all the defect sizes of interest.

The above discussion is for calculating the total average critical area. An embodiment of the invention can be used to calculate the total critical area for a single defect size as well. If that is desired, there is not much difference in computational cost between the methods described herein and some traditional methods. But for situations that require average critical area, the methods described herein can be much more efficient.

After the average critical area $A_{cr}$ over the layout objects of interest is calculated in step 312, it may be used for a number of different purposes. It may be used for yield prediction, for example, or for choosing among two or more implementations for a particular design. It can also be used in the physical verification step to check whether the critical area is within a given constraint, or incremental evaluation of the changes in the average critical area due to layout modifications. The method described herein can also be used in a cost function for global or detail routing. In step 314, as yet another example, the average critical area value determined in step 312 is used in a cost function for post-route yield optimization. Many other uses for the average critical area value are known, or will be apparent to the reader.

Figure 4:
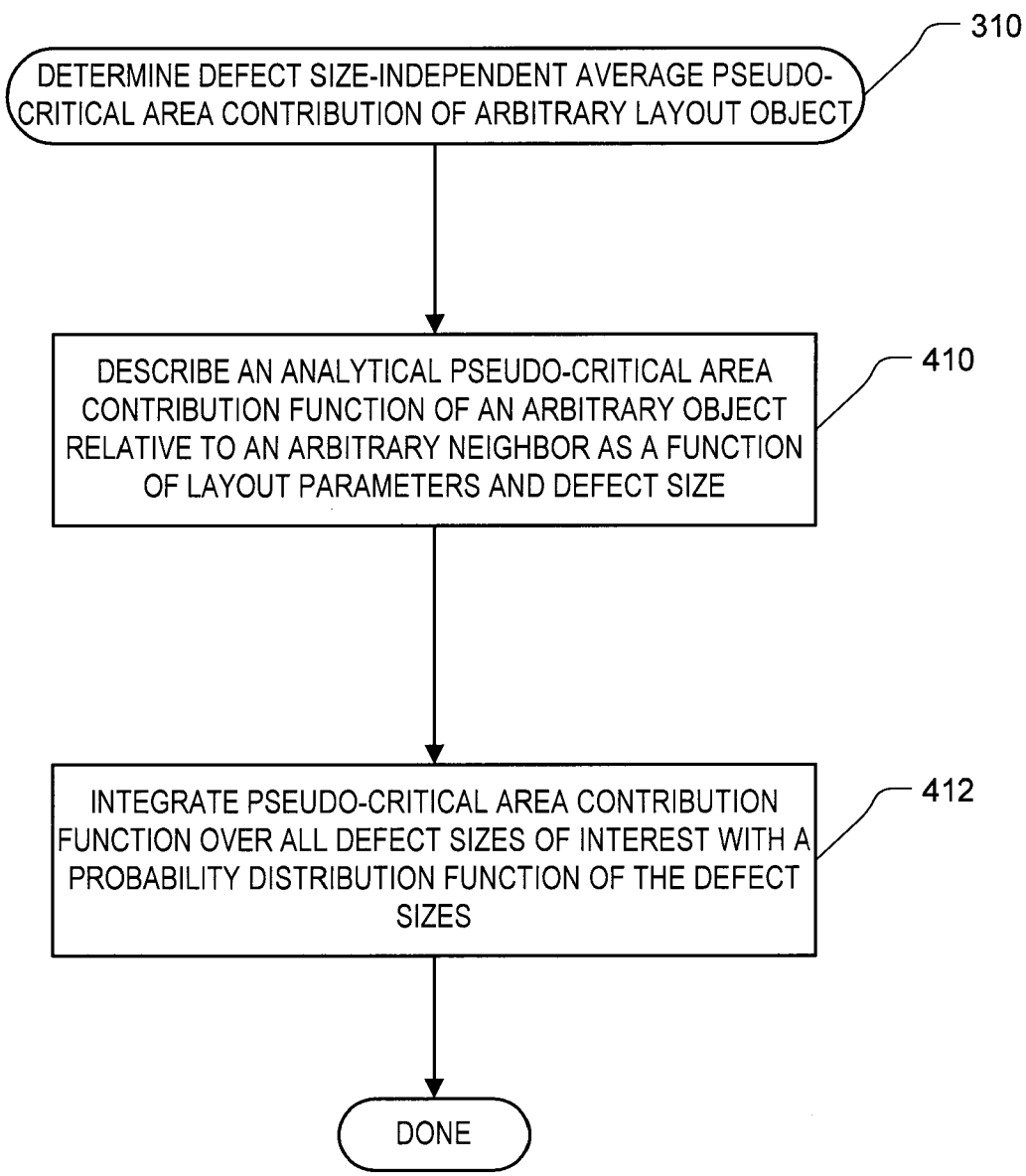

FIG. 4 is a flowchart of an overall method for determining an average pseudo-critical area contribution function of an arbitrary layout object, which is already representative of all defect sizes of interest. As used herein, the term "average" refers to an average over the defect sizes of interest rather than an average over more than one object. Initially, in step 410, an analytical pseudo-critical area contribution function of an arbitrary object relative to an arbitrary neighbor is described as a function of layout parameters and defect size. At this stage the function is still dependent upon the defect size, however that quantity might be expressed in the particular embodiment. In the embodiments described herein, as previously mentioned, defects are approximated as discs, the location of the disc centerpoint is considered to be the location of the disc, and the disc diameter is taken as its defect size. Other embodiments can make different shape and size approximations for the defects under consideration, such as squares, rectangles or more complicated shapes. Preferably but not necessarily the defect "size" is varied by a single variable in the average pseudo-critical area contribution function.

In step 412, the average pseudo-critical area contribution function is integrated over all defect sizes of interest with a probability distribution function of the defect sizes. Any distribution function can be used, but the present embodiment uses the well-known function of equation (3):

$$f(x) = \begin{cases} \dfrac{x}{x_0^2} & \text{if } 0 < x \le x_0 \\ \dfrac{x_0^2}{x^3} & \text{if } x_0 \le x \le x_{max}, \end{cases} \quad (3)$$

where $x_0$ is the minimal spacing in the design rules.

The formula for total critical area as a function of defect size will be different for different kinds of yield-affecting conditions. By way of example, formulas for two such conditions, defects creating a risk of short circuit conditions and defects creating a risk of open circuit conditions, will now be derived. For purposes of the following discussion, the term "wire" is used herein to denote a region of electrically conductive material in a layer. The term "net" is used to denote a group of electrically conductive materials that always has same electrical signal in the circuit. In the embodiments described herein, a "wire" is broken into "objects" at corners, and "objects" can be further broken into "segments" at equation applicability condition boundaries, discussed below. However, it will be appreciated that in another embodiment, "segments" can be defined differently and, if necessary, the equations can be adjusted accordingly.

Formula for "Short" Critical Area as a Function of Defect Size

Figure 5:
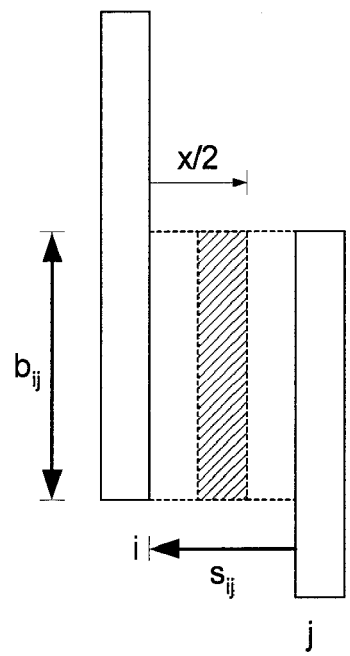

If a pair of parallel wires i and j belonging to different nets have portions visible to each other, as shown in FIG. 5, the critical area for this pair of wires at a particular defect size x is simply $$A_c(x) = \begin{cases} 0 & \text{if } x < s_{ij}, \\ (x - s_{ij})b_{ij} & \text{if } x \ge s_{ij}. \end{cases} \quad (4)$$

Equation (4) is an effort to formulate the critical area analytically. There are at least two major problems with this formulation. One is that if total critical area is computed as $$A_c(x) = \sum_i \sum_{nbr\ j\ of\ i} A_{ij}(x), \quad (5)$$

where the term "nbr j of i" is read, "neighbor j of object i," then the same critical area $A_{ij}(x)$ and $A_{ji}(x)$ is going to be double counted. Another major problem is that when the defect size is large, the critical area arising due to wire pair (i,j) might overlap with the critical area arising due to another wire pair (i,k), such as area E shown in FIG. 6. That is, a particle might short the wire pair (i, k) and the wire pair (i, j) at the same time, if the particle is large enough. Equation (4) does not handle the overlap regions at all. The summation of such critical areas would result in double counting of these overlap regions.

In order to solve this problem, the present embodiment describes the total critical area as a summation of "pseudo-critical" areas between every pair of "visible" object segments. One object segment is considered herein to be "visible" to another in a particular direction if a straight line can be drawn in that direction so as to intersect both segments without crossing another object that affects the critical area of the layout region. The "visibility length" $b_{ij}$ of a pair of object segments is defined herein as the length of one object segment which is "visible" to the other; the visibility length is sometimes referred to herein as the "mutual visibility length", since it should be the same regardless of from which segment the view is taken (so $b_{ij}=b_{ji}$).

The pseudo-critical area $\hat{A}_{ij}(x)$ is defined in such a way that no critical area region on the layout, which arises due to any neighboring pair of objects, is included in the "pseudo-critical" area of more than one object pair. Stated mathematically:

$$\hat{A}_{ij}(x) \cap \hat{A}_{mn}(x) = \emptyset, \forall (i,j) \ne (m,n). \quad (7)$$

Note that the subscript (i,j) is order sensitive, i.e., $\hat{A}_{ij}(x) \ne \hat{A}_{ji}(x)$. In order to satisfy equation (7), pseudo-critical areas are defined in the present embodiment such that critical area regions that arise because of a particular pair of objects i and j are assigned either to object pair (i,j), or to object pair (j,i), or are allocated partially to each in a non-overlapping manner. As used herein, the segment pair (i, j) is referred to herein as an "ordered" pair, meaning the pair (i,j) is to be considered a separate pair from the pair (j,i). Accordingly, an iteration over all "ordered" pairs (i,j) would count pair (i,j) separately from pair (j,i).

Figure 6:
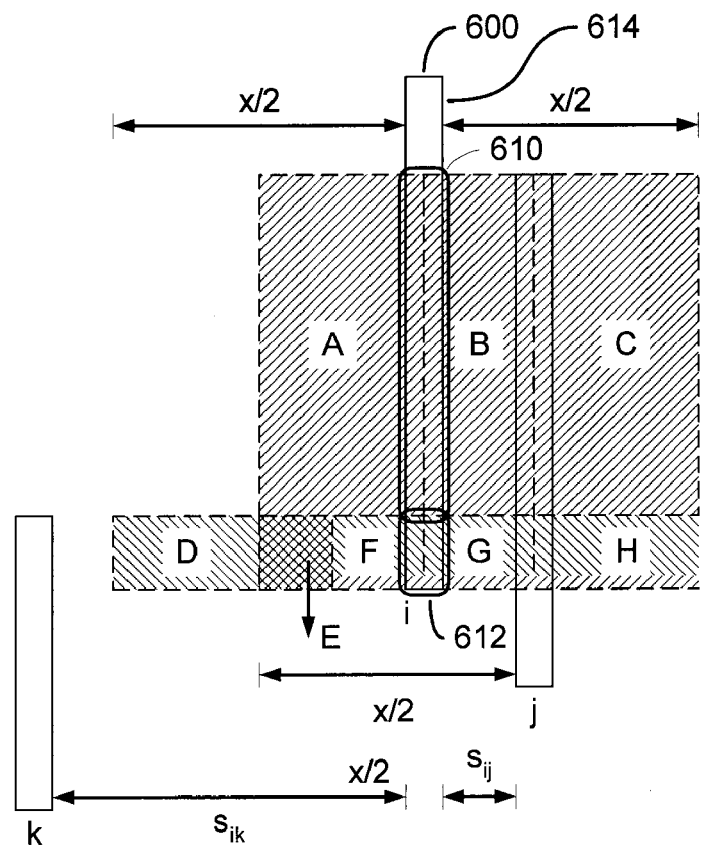

FIG. 6 shows an object i and two neighboring objects j and k on opposite sides (right and left, respectively). As shown in FIG. 6, object 600 has been split into three segments 610, 612 and 614. Segment 610 has one visible neighbor j (in the rightward direction) and no visible neighbors on the other side (in the leftward direction). Segment 612 has visible neighbors j and k on both sides (in both the leftward and rightward directions). Segment 614 has no visible neighbors, and is ignored in the following analysis for short critical area because, in a simplification, it has no possibility of being shorted with any other object in the figure regardless of defect size.

FIG. 6 shows that for the segment 610, the critical area region A+B+C for a defect size x that is larger than twice the spacing $s_{ij}$ between object segments i and j. It can be seen that this region extends from a position to the left of the leftmost segment i, to a position to the right of rightmost segment j. As shown in FIG. 6, the overall region has been divided into a region A, which extends from the leftmost boundary of the overall region to the center of segment i, a region B which extends from the center of segment i to the center of segment j, and a region C which extends from the center of segment j to the rightmost boundary of the overall region. For this situation, the present embodiment allocates region A to object pair (i,j) and region C to object pair (j,i), and allocates region B half to object pair (i,j) and half to object pair (j,i). Therefore, in the present embodiment, for segment 610, the pseudo-critical area is defined as $$\hat{A}_{ij}(x) \triangleq A + B/2, \hat{A}_{ji}(x) \triangleq B/2 + C. \tag{9}$$

Note that the sum of the two pseudo-critical areas does equal the actual critical area:

$$\hat{A}_{ij}(x) + \hat{A}_{ji}(x) = A+B+C = A_{ij}(x), \tag{10}$$

and note further that the condition of eq. (7) holds:

$$\hat{A}_{ij}(x) \cap \hat{A}_{ji}(x) = \emptyset. \tag{11}$$

Each portion of the overall critical area region of the object segment pair (i,j) is included in one and only one pseudo-critical area region.

Through analyses such as that above with respect to FIG. 6, the present embodiment analytically defines a pseudo-critical area function for any segment of wire i that has a visible neighbor j in exactly one direction as:

$$\hat{A}_{ij}(x) \triangleq \tag{12}$$

$$\begin{cases} 0, & \text{if } x \le s_{ij}, \\ (x - s_{ij})b_{ij}/2, & \text{if } s_{ij} < x \le 2s_{ij} + \min(w_i, w_j), \\ (s_{ij} + \min(w_i, w_j))b_{ij}/2 + \\ \left(\frac{x}{2} - s_{ij} - \frac{\min(w_i, w_j)}{2}\right)b_{ij}, & \text{if } 2s_{ij} + \min(w_i, w_j) < x \le D_{max}, \end{cases}$$

where $b_{ij}$ is the length of the overlap portion between object segments i and j, $s_{ij}$ is the spacing between object segments i and j, $w_i$ and $w_j$ are the wire-widths for the two wires, and $D_{max}$ is the maximum random defect size of interest. The layout parameters taken into account in Eq. (12) are $b_{ij}$, $s_{ij}$, $w_i$ and $w_j$.

For segment 612, which has visible neighbors on both sides, the critical area region includes subregions G and H to the right of segment i, defined as set forth above for subregions B and C. To the left of segment i the critical area region includes subregions E and F, which are distinct but in conjunction are defined as set forth above for subregion A. In addition, to the left of segment i, subregion D+E is the critical area between wire i and wire k. Subregion E is an overlap region that arises both because of the proximity between wire i and wire j and the proximity between wire i and wire k.

In the present embodiment, the pseudo-critical area for segments having visible neighbors on both sides has one component $\hat{A}_{ij}(x)$ accounting for subregions arising because of the proximity of one neighbor j, and another component $\hat{A}_{ik}(x)$ accounting for subregions arising because of the proximity of the other neighbor k. $\hat{A}_{ij}(x)$ is defined similarly to its definition for segments having only one visible neighbor j:

$$\hat{A}_{ij}(x) \triangleq F + G/2, \tag{16}$$

where the region F is the region of the critical area $A_{ij}(x)$ that goes away from wire j in the direction opposite wire i, but is not covered by the k-side critical area $A_{ik}(x)$. The region E, which is the overlap region between the critical areas $A_{ij}(x)$ and $A_{ik}(x)$, is included as part of the pseudo-critical area $A_{ik}(x)$:

$$\hat{A}_{ik}(x) \triangleq D/2 + E/2. \tag{17}$$

Similarly, regions included in $\hat{A}_{ik}(x)$ should not be allowed go to the other side of wire i (farther from wire k than wire i) because that part has been covered by $\hat{A}_{ij}(x)$. The region H is already totally included as part of pseudo-critical area $\hat{A}_{ji}(x)$. Following these steps, every region in the shaded area as shown in FIG. 6 is included in exactly one pseudo-critical area. The present embodiment thus analytically defines a pseudo-critical area function for any segment of wire i that has visible neighbors j and k on opposite sides as set forth in Equations (21), (22), (23).

When $2s_{ij} + \min(w_i, w_j) < 2s_{ik} + \min(w_i, w_k)$, (21)

$$\hat{A}_{ij}(x) \triangleq$$

$$\begin{cases} 0, & \text{if } x \le s_{ij}; \\ \frac{(x - s_{ij})b_{ij}}{2}, & \text{if } s_{ij} < x \le 2s_{ij} + \min(w_i, w_j); \\ (s_{ij} + \min(w_i, w_j))b_{ij}/2 + \\ \left(\frac{x}{2} - s_{ij} - \frac{\min(w_i, w_j)}{2}\right)b_{ij}, & \text{if } 2s_{ij} + \min(w_i, w_j) < \\ & x \le s_{ij} + s_{ik} + w_i; \\ (s_{ij} + \min(w_i, w_j))b_{ij}/2 + \\ \left[\left(\frac{x}{2} - s_{ij} - \frac{\min(w_i, w_j)}{2}\right) - \\ (x - s_{ij} - s_{ik} - w_i)\right]b_{ij}, & \text{if } s_{ij} + s_{ik} + w_i < x \le \\ & 2s_{ik} + 2w_i - \min(w_i, w_j); \\ (s_{ij} + \min(w_i, w_j))b_{ij}/2, & \text{if } 2s_{ik} + 2w_i - \\ & \min(w_i, w_j) < x \le D\max. \end{cases}$$

-continued

When $2s_{ij} + \min(w_i, w_j) > 2s_{ik} + \min(w_i, w_k)$, (22)

$\hat{A}_{ij}(x) \triangleq$ $\begin{cases} 0, & \text{if } x \leq s_{ij}; \\ (x - s_{ij})b_{ij}/2, & \text{if } s_{ij} < x \leq 2s_{ij} + \min(w_i, w_j); \\ (s_{ij} + \min(w_i, w_j))b_{ij}/2 + \\ \left(\dfrac{x}{2} - s_{ij} - \dfrac{\min(w_i, w_j)}{2}\right)b_{ij}, & \text{if } 2s_{ij} + \min(w_i, w_j) < x \leq 2s_{ij} + 2w_i - \min(w_i, w_k); \\ (s_{ij} + \min(w_i, w_j))b_{ij}/2 + \\ \left(w_i - \dfrac{\min(w_i, w_j)}{2} - \dfrac{\min(w_i, w_k)}{2}\right)b_{ij}, & \text{if } 2s_{ij} + 2w_i - \min(w_i, w_k) < x \leq D\text{max.} \end{cases}$ When $2s_{ij} + \min(w_i, w_j) = 2s_{ik} + \min(w_i, w_k)$, (23)

$\hat{A}_{ij}(x) \triangleq$ $\begin{cases} 0, & \text{if } x \leq s_{ij}; \\ (x - s_{ij})b_{ij}/2, & \text{if } s_{ij} < x \leq 2s_{ij} + \min(w_i, w_j); \\ (s_{ij} + \min(w_i, w_j))b_{ij}/2 + \\ \left(\dfrac{x}{2} - s_{ij} - \dfrac{\min(w_i, w_j)}{2}\right)b_{ij}, & \text{if } 2s_{ij} + \min(w_i, w_j) < x \leq s_{ij} + s_{ik} + w_i; \\ (s_{ij} + \min(w_i, w_j))b_{ij}/2 + \\ \left(\dfrac{s_{ij} + s_{ik} + w_i}{2} - s_{ij} - \dfrac{\min(w_i, w_j)}{2}\right)b_{ij}; & \text{if } 2s_{ij} + s_{ik} + w_i < x \leq D_{max}. \end{cases}$ It will be appreciated that the above formulas for the pseudo-critical area as a function of defect size derives from certain conventions about how various critical area subregions, which arise due to more than one pair of neighboring objects, are to be allocated in a non-overlapping manner to each pair. Two examples of allocation strategies are included in the above derivation. For subregions of the critical area that are located between the wire pair (i,j), half of the subregion is assigned to the pseudo critical area of wire pair (i,j), the other half is assigned to the pseudo critical area of wire pair (j,i). More generally, a fraction δ of the critical area may be allocated to one of the pairs (i,j), and the remaining fraction (1−δ) allocated to the other pair (j,i), 0<=δ<=1. In the above derivation, δ=½.

Similarly, for overlapping subregions that arise because the critical area due to wire pair (i,j) overlaps with the critical are due to a different wire pair (i,k), and these regions are located between the wires i and k, then half of them are assigned to the pseudo critical area of wire pair (i,k), half of them are assigned to the pseudo critical area of wire pair (k,i), and none is assigned to that of the wire pair (i,j). Again, more generally, a fraction δ of the critical area may be allocated to one of the pairs (i,j), and the remaining fraction (1δ) allocated to the other pair (i,k), 0<=δ<=1. Other variations will be apparent. In general, δ can be a function of the defect size x, but in the present embodiment δ is constant for all defect sizes.

Now that an analytical formula has been derived for the pseudo-critical area contribution function of an arbitrary object i relative to an arbitrary neighbor j or neighbors j and k, as a function of layout parameters and defect size, as previously mentioned, an analytical formula for the average pseudo-critical area contribution, averaged over all defect sizes of interest, can now be derived by integrating this function over all defect sizes of interest with a probability distribution function of the defect sizes. Using the probability distribution function of eq. (3), the following functions are thus derived.

For object segments having only one side visible neighbor, the average short pseudo-critical area can be written as $$A_{S1ij} = x_0^2 b_{ij}\left[\frac{1}{4s_{ij}} + \frac{s_{ij}}{4D_{max}^2} - \frac{1}{2D_{max}}\right]. \quad (24)$$

For object segments having visible neighbors in two opposite directions, the average short pseudo-critical area can be written as follows.

When $2s_{ij} + \min(w_i, w_j) < 2s_{ik} + \min(w_i, w_k)$, (25)

$$A_{S2ij} = x_0^2 b_{ij}\left[\begin{array}{l}\dfrac{1}{4s_{ij}} - \dfrac{1}{2(s_{ij} + s_{ik} + w_i)} + \\ \dfrac{1}{4\left(\begin{array}{l}2s_{ik} + 2w_i - \\ \min(w_i, w_j)\end{array}\right)} - \dfrac{s_{ij} + \min(w_i, w_j)}{4D_{max}^2}\end{array}\right].$$

When $2s_{ij} + \min(w_i, w_j) > 2s_{ik} + \min(w_i, w_k)$, (26)

$$A_{S3ij} = x_0^2 b_{ij}\left[\begin{array}{l}\dfrac{1}{4s_{ij}} - \dfrac{1}{4(2s_{ij} + 2w_i - \min(w_i, w_j))} - \\ \dfrac{s_{ij} + 2w_i - \min(w_i, w_j)}{4D_{max}^2}\end{array}\right].$$

When $2s_{ij} + \min(w_i, w_j) = 2s_{ik} + \min(w_i, w_k)$, (27)

$$A_{S4ij} = x_0^2 b_{ij}\left[\frac{1}{4s_{ij}} - \frac{1}{4(s_{ij} + s_{ik} + w_i)} - \frac{s_{ik} + w_i}{4D_{max}^2}\right].$$

The above functions describe analytically the average pseudo-critical area for each kind of object segment pair that includes a segment of object i. They satisfy the condition set forth in eq. (7) for every defect size x of interest, and therefore can simply be summed over all such object segments and objects in order to calculate the geometric union of the actual short critical area, and thus the total average short critical area of the layout. That is, $$A_{crOpen} = \sum_i \sum_j A_{sij}, \quad (28)$$

where $A_{sij}$ is the short critical area contribution value $A_{s1ij}$, $A_{s2ij}$, $A_{s3ij}$ or $A_{s4ij}$, of object segment i as related to object segment j, and is given by equation (24), (25), (26) or (27) as the case may be.

Formula for "Open" Critical Area as a Function of Defect Size

Theoretically, the basic derivation of the open critical area formulae is a dual of the derivation for short critical area. For completeness, we describe the formulation for open critical area in detail as well.

Figure 18:
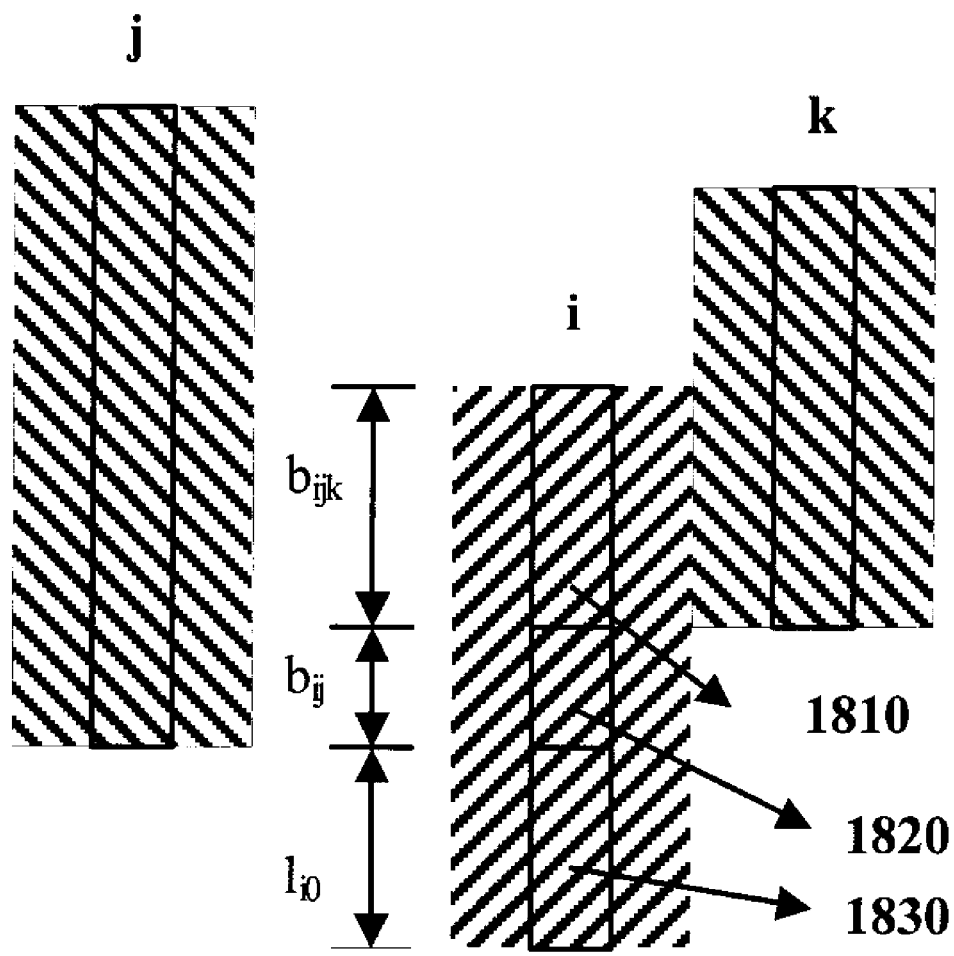

As shown in FIG. 18, open critical area is formulated for object i. The segment 1810 has visible neighbors j and k on both sides, with length $b_{ijk}$. The segment 1820 has only one side neighbor j, with length $b_{ij}$. The segment 1830 has no visible neighbors on either side, with length $l_{io}$. For an object segment that has no visible neighbors, such as segment 1830 in FIG. 18, it is assumed that the defect must overlap the entire width $w_i$ in order to risk an open defect. Thus for this segment, the pseudo-critical area contribution in the present embodiment is defined to be the same as the actual open critical area. It is a function of defect size x, as shown in equation (29).

$$\hat{A}_i(x) \triangleq \begin{cases} 0 & \text{if } x \leq w_i \\ (x - w_i)l_{i0} & \text{if } w_i < x \leq D_{max}. \end{cases} \quad (29)$$

where $l_{i0}$ is the length of the segment that has no visible neighbors on either side, and $D_{max}$ is the maximum defect size. Integrating equation (29) with the probability distribution function in equation (3) yields $$A_{oli} = x_0^2 l_{i0} \left[ \frac{1}{2w_i} - \frac{1}{D_{max}} + \frac{w_i}{2D_{max}^2} \right]. \quad (30)$$

For a segment i that has exactly one side neighbor j, such as segment 1820 in FIG. 18, the open critical area of object i might overlap with open critical area of object j if the defect size is large. For small defect sizes, there is no overlap and the pseudo-critical area contribution is the same as the actual open critical area. Its formulation is the same as in equation (29). With increasing defect size, the pseudo-critical area grows as well. When the actual open critical area of object i begins to overlap the actual open critical area of object j, in order to avoid calculating the overlapping region more than once, the pseudo-critical area contribution for object i in this situation is defined so as to stop growing on the side that has visible neighbor j. The other side of the pseudo-critical area continues growing with increasing defect size. The formulation for pseudo-critical area of the segment of object i that has only one side visible neighbor j is $$\hat{A}_{ij}(x) \triangleq \begin{cases} 0 & \text{if } x \leq w_i \\ (x - w_i)b_{ij} & \text{if } w_i < x \leq s_{ij} + w_i + w_j \\ \left( \frac{x}{2} - w_i + \frac{s_{ij} + w_i + w_j}{2} \right)b_{ij} & \text{if } s_{ij} + w_i + w_j < x \leq D_{max}, \end{cases} \quad (31)$$

where $b_{ij}$ is the length for the segment that has only one side visible neighbor j. Integrating equation (31) with the probability distribution function of equation (3) yields $$A_{olij} = x_0^2 b_{io} \left[ \frac{1}{2w_i} - \frac{1}{4(s_{ij} + w_i + w_j)} - \frac{1}{2D_{max}} - \frac{s_{ij} - w_i + w_j}{4D_{max}^2} \right]. \quad (32)$$

For a segment i that has two neighbors j and k on opposite sides, such as segment 1810 in FIG. 18, the definition for the pseudo-critical area is similar to that for the segment with only one side visible neighbor. The key point is that whether or not one side of the pseudo-critical area should stop growing with increasing defect size is determined by whether or not the actual critical area of this segment begins to overlap the actual critical area of the neighboring object on that side. The formulation for pseudo-critical area for a segment of object i that has visible neighbors j and k on both sides is therefore given by equation (33). This formulation, without loss of generality, assumes the spacing $s_{ij}$ between object i and its one side neighbor j is smaller than the spacing $s_{ik}$ between object i and it's the other side neighbor k.

$$\hat{A}_{ijk}(x) \triangleq \quad (33)$$

$$\begin{cases} 0 & \text{if } x \leq w_i \\ (x - w_i)b_{ijk} & \text{if } w_i < x \leq s_{ij} + w_i + w_j \\ \left( \frac{x}{2} - w_i + \frac{s_{ij} + w_i + w_j}{2} \right)b_{ijk} & \text{if } s_{ij} + w_i + w_j < x \leq s_{ik} + w_i + w_k \\ \left( \frac{\frac{s_{ij} + w_i + w_j}{2} +}{\frac{s_{ik} + w_i + w_k}{2} - w_i} \right)b_{ijk} & \text{if } s_{ik} + w_i + w_k < x \leq D_{max}. \end{cases}$$

where $b_{ijk}$ is the length of the segment that has visible neighbors on both sides. Integrating equation (33) with the probability distribution function of equation (3) yields $$A_{o3ijk} = x_0^2 b_{ijk} \left[ \frac{1}{2w_i} - \frac{1}{4(s_{ij} + w_i + w_j)} - \frac{1}{4(s_{ik} + w_i + w_k)} - \frac{w_j + w_k + s_{ij} + s_{ik}}{4D_{max}^2} \right] \quad (34)$$

As with equations (24), (25), (26) and (27) for the short defect analysis, equations (30), (32) and (34) describe analytically the average open pseudo-critical area for each kind of object segment in an object i. They satisfy the condition set forth in eq. (7) for every defect size x of interest, and therefore can simply be summed over all such object segments and objects in order to calculate the geometric union of the actual open critical area. That is, $$A_{crOpen} = \sum_i \sum_j A_{oij}, \quad (35)$$

where $A_{oij}$ is the open critical area contribution value $A_{o1i}$, $A_{o2ij}$ or $A_{o3ijk}$, from equations (30), (32) or (34) above, depending on whether the object segment i has visible neighbors on zero, one or two sides respectively.

In the case of the open defect analysis, the average pseudo-critical area equations can be combined and simplified to the single form of equation (36):

$$A_{crOpen} = x_0^2 \sum_i \left[ A_{oi} + \sum_{nbr\ j} A_{oij} \right], \quad (36)$$

where $$A_{oi} = -\frac{l_{i1}}{2D_{max}} + \frac{w_i l_{i1}}{4D_{max}^2} - \frac{l_{i0}}{D_{max}} + \frac{w_i l_{i0}}{2D_{max}^2} + \frac{l_i}{2w_i}, \quad (37)$$

$$A_{oij} = -\frac{b_{ij}}{4(s_{ij} + w_i + w_j)} - \frac{(w_j + s_{ij})b_{ij}}{4D_{max}^2}, \quad (38)$$

"nbr j" refers to a visible neighboring object segment j, $l_i$ is the total length of object i, $l_{i0}$ is the total length of the segments of object i that have no visible neighboring segments, $l_{i1}$ is the total length of the segments of object i that have exactly one side visible neighboring segment, and $b_{ij}$ and $s_{ij}$ are the overlap length and spacing, respectively, between object i and its visible neighboring segment j.

The average open pseudo-critical area contribution arising from a single object p is therefore $$A_{op} + \sum_{nbr\ q} A_{opq}, \tag{39}$$

where $$A_{op} = -\frac{l_{p1}}{2D_{max}} + \frac{w_p l_{p1}}{4D_{max}^2} - \frac{l_{p0} w_i}{D_{max}} + \frac{w_p l_{p0}}{2D_{max}^2} + \frac{l_p}{2w_p}, \tag{40}$$

$$A_{opq} = -\frac{b_{ij}}{4(s_{pq} + w_p + w_q)} - \frac{(w_q + s_{pq}) b_{pq}}{4D_{max}^2}, \tag{41}$$

"nbr q" refers to a visible neighboring object segment q,
$l_p$ is the total length of object p,
$l_{p0}$ is the total length of the segments of object p that have no visible neighboring segments,
$l_{p1}$ is the total length of the segments of object p that have exactly one side visible neighboring segment,
and $b_{pq}$ and $s_{pq}$ are the overlap length and spacing, respectively, between object p and its visible neighboring object q.

Summing Pseudo-Critical Area Contributions of All Objects of Interest

Figure 7:
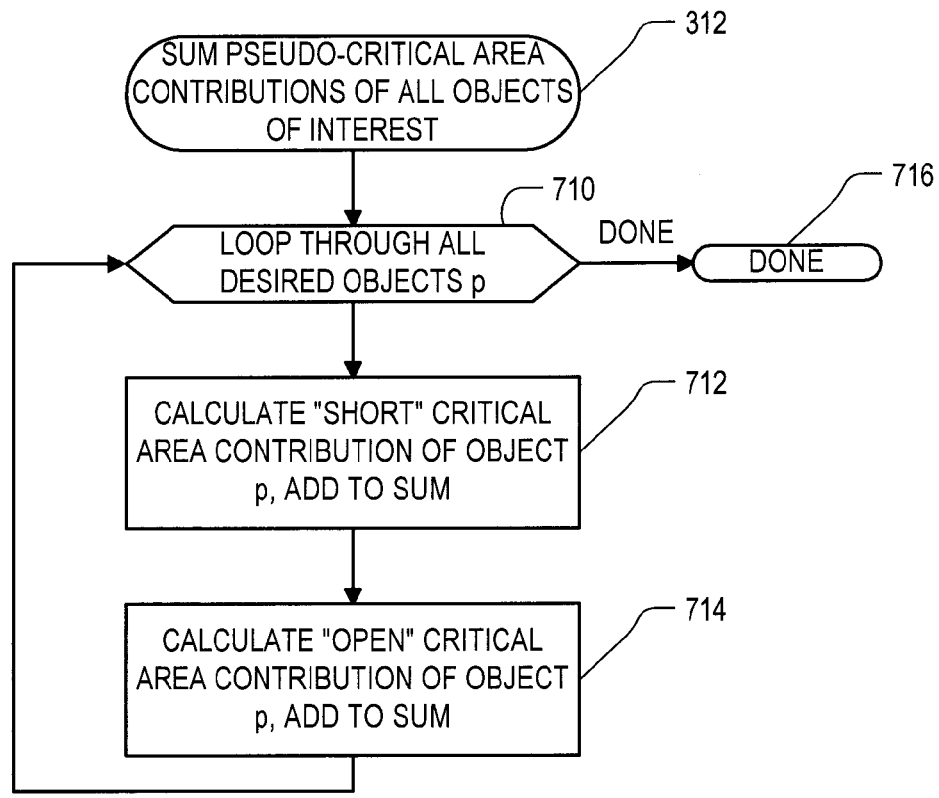

Returning to FIG. 3, now that an analytical function has been developed for a defect size-independent average pseudo-critical area contribution of arbitrary layout objects (step 310), the actual critical area of the design can be approximated quickly and with high accuracy simply by summing the average pseudo-critical area contributions of all objects of interest in the layout (step 312). FIG. 7 is an overall flow chart illustrating one of many possible methods for calculating the sum.

Referring to FIG. 7, in step 710, the routine loops through all objects p of interest. If the critical area of the entire layout layer is desired, then step 710 might loop through all objects in the layout layer. If the critical area of only a region of the layer is desired, then step 710 might loop through only the objects in the region. Note that the present discussion uses the subscripts p and q to identify an object and its neighbors, respectively, so that the subscripts i and j can be available to identify object segments and their neighboring segments, respectively.

In step 712, the routine calculates the average short critical area contributed by object p, and adds it to a sum. Similarly, in step 714, the routine calculates the average open critical area contributed by object p, and adds that value to another sum. The routine then loops back to step 710 to evaluate the next object p. When all desired objects have been evaluated, the routine exits (step 716) with two sums: one approximating the average short critical area and one approximating the average open critical area of the layer or region of interest.

Figure 8:
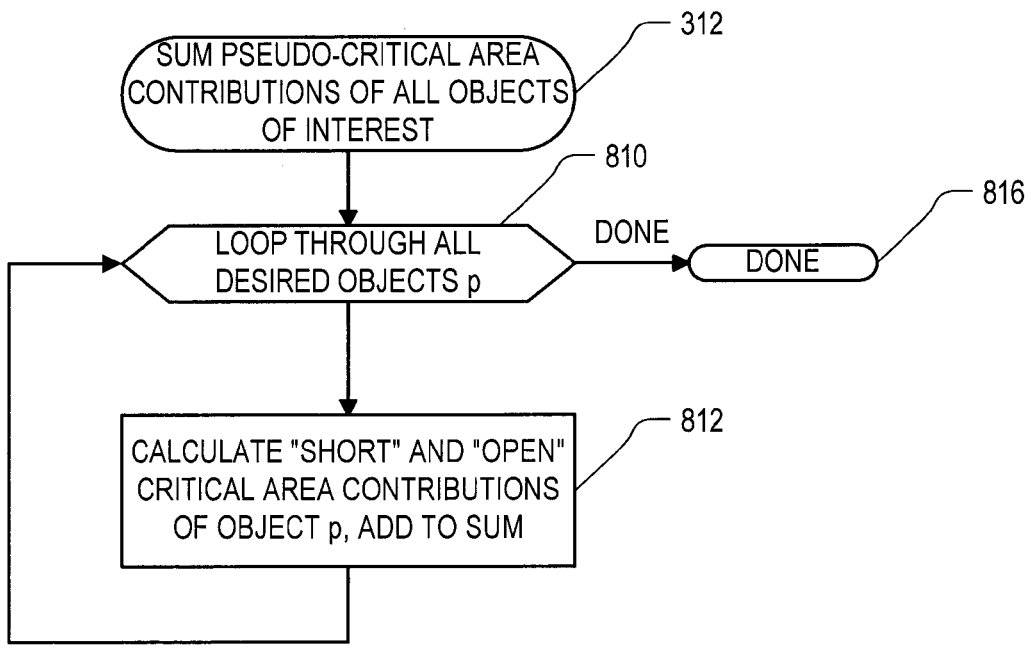

In the flowchart of FIG. 7, as in all flowcharts herein, it will be appreciated that many of the steps can be combined, performed in parallel or performed in a different sequence without affecting the functions achieved. FIG. 8 is one such variation. Referring to FIG. 8, in step 810, as in step 710, the routine loops through all objects p of interest. In step 812, though, the routine combines steps 712 and 714 into a single step for calculating both the short and open critical area contributions of the current object p, and adding them to respective sums. The remainder of the flowcharts herein follow the FIG. 8 version of the algorithm.

Figure 9:
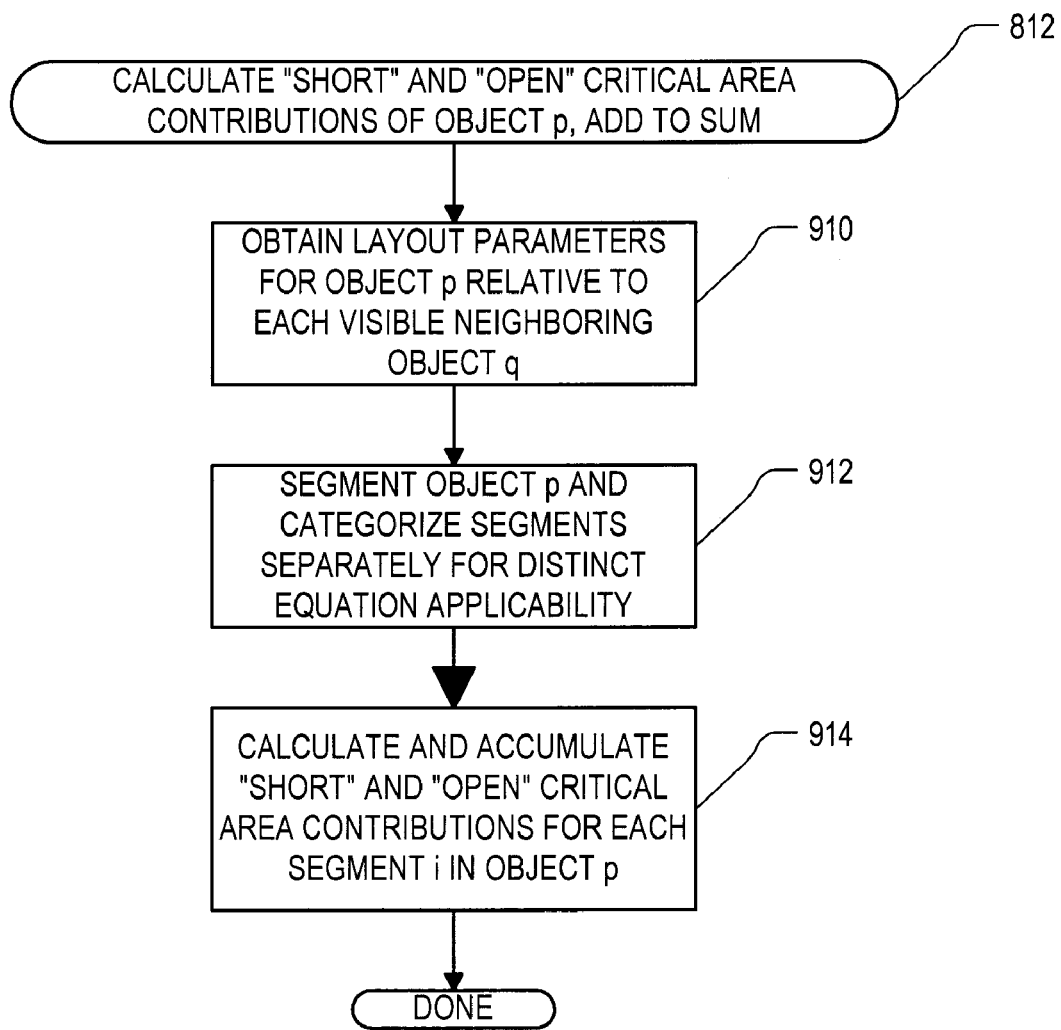

FIG. 9 is a detail of step 812 in FIG. 8, for calculating average short and open critical area contributions of a particular object p. In step 910, the routine first obtains layout parameters for object p relative to each visible neighboring object q. The layout parameters include, for example, $s_{pq}$, $b_{pq}$, $w_p$ and $w_q$. The neighboring objects include those that are left, right, up and down relative to object p.

Figure 10:
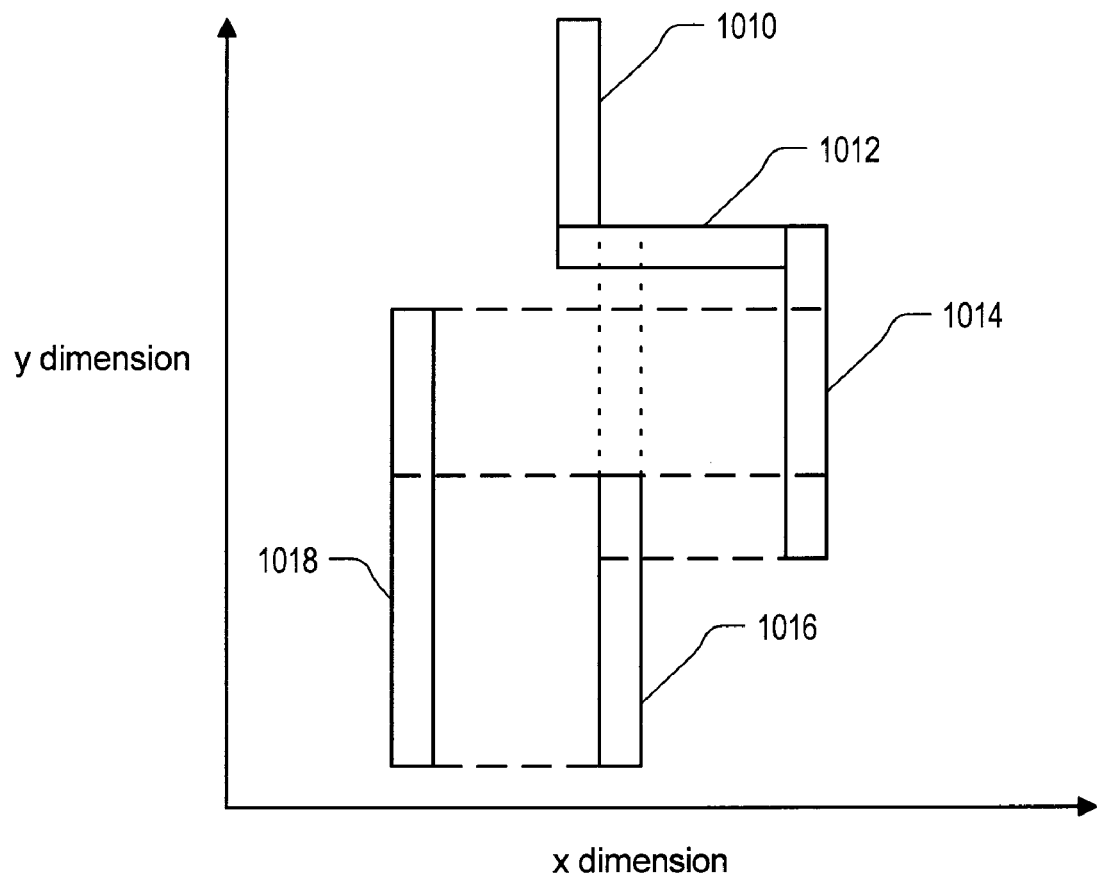
FIGS. 10 and 13 illustrate several objects in a layout layer.

Because the algorithm as implemented herein treats all four directions alike, conventions will be useful for defining terms like the "width" and "length" of an object. As used herein, a layout layer is considered herein to have two orthogonal dimensions, sometimes referred to herein as the horizontal, or x, dimension and the vertical, or y, dimension. FIG. 10 illustrates a sample layout region having five objects 1010, 1012, 1014, 1016 and 1018. Objects 1010, 1014, 1016 and 1018 are oriented vertically, in the sense that their size is greater in the y dimension than in the x dimension. Similarly, object 1012 is oriented horizontally, in the sense that its size is greater in the x dimension than in the y dimension. In general, the "width" of an object refers to the size of the object in the same dimension as the object's spacing to another object. Thus when considering the pair of objects 1018 and 1016, the "width" of object 1016 is its size in the x dimension. When considering the pair of objects 1012 and 1016, the "width" of object 1016 is its size in the y dimension.

The algorithm need not take into account the contributions of every wire or every pair of wires in a fabrication layer. For example, whereas the embodiments described herein for approximating the average short critical area takes into account all objects p in the layer regardless of orientation, another embodiment might consider only objects p that are oriented in a preferred direction, horizontal or vertical, of the current layer. A wire extending perpendicular to the preferred direction might be skipped during the iterations of such an embodiment. Such a simplification would reduce the accuracy of the resulting critical area calculation, but nevertheless might be appropriate in certain circumstances. As another example, the calculation may be limited to only a particular region of the layer. On the other hand, other embodiments might yield better accuracy than in the present embodiment, such as by including diagonally neighboring objects q rather than only those that are left, right, up or down relative to the current object p. An embodiment could handle diagonally neighboring objects by enlarging each object slightly in all four directions before using the method as otherwise described herein.

In step 912, object p is segmented at equation applicability boundaries. More particularly, it will be recalled that for the short critical area calculation, each of the equations (24), (25), (26) and (27) apply under different topological conditions: equation (24) applies to segments i having only one visible neighboring segment, equation (25) applies to segments i having two visible neighboring segments j and k in opposite directions and for which $2s_{ij}+\min(w_i,w_j)<2s_{ik}+\min(w_i,w_k)$, equation (26) applies to segments i having two visible neighboring segments j and k in opposite directions and for which $2s_{ij}+\min(w_i,w_j)>2s_{ik}+\min(w_i,w_k)$, and equation (27) applies to segments i having two visible neighboring segments j and k in opposite directions and for which $2s_{ij}+\min(w_i,w_j)=2s_{ik}+\min(w_i,w_k)$. Step 912 therefore segments object p into one or more object segments i, each of which fits the conditions for exactly one of these equations for its entire length. Referring to FIG. 6, for example, object segment 600 is broken up into segment 610, for which equation (24) applies along its entire length, and segment 612, for which equation (25) applies along its entire length. Segment 614 does not contribute to the short critical area calculation, but it is not ignored because it does contribute to the open critical area contribution. It will be appreciated that different assumptions and simplifications in the derivations in step 310 (FIG. 3) might yield different equation applicability conditions and therefore might, in different embodiments, require different segmentation (or no segmentation) of object p.

In step 914, the routine calculates the short and open critical area contributions for each segment i in object p, using the respective applicable equation (24), (25), (26) or (27) for the short critical area and (36) for the open critical area, and accumulates them into respective short and open critical area sums.

Figure 11:
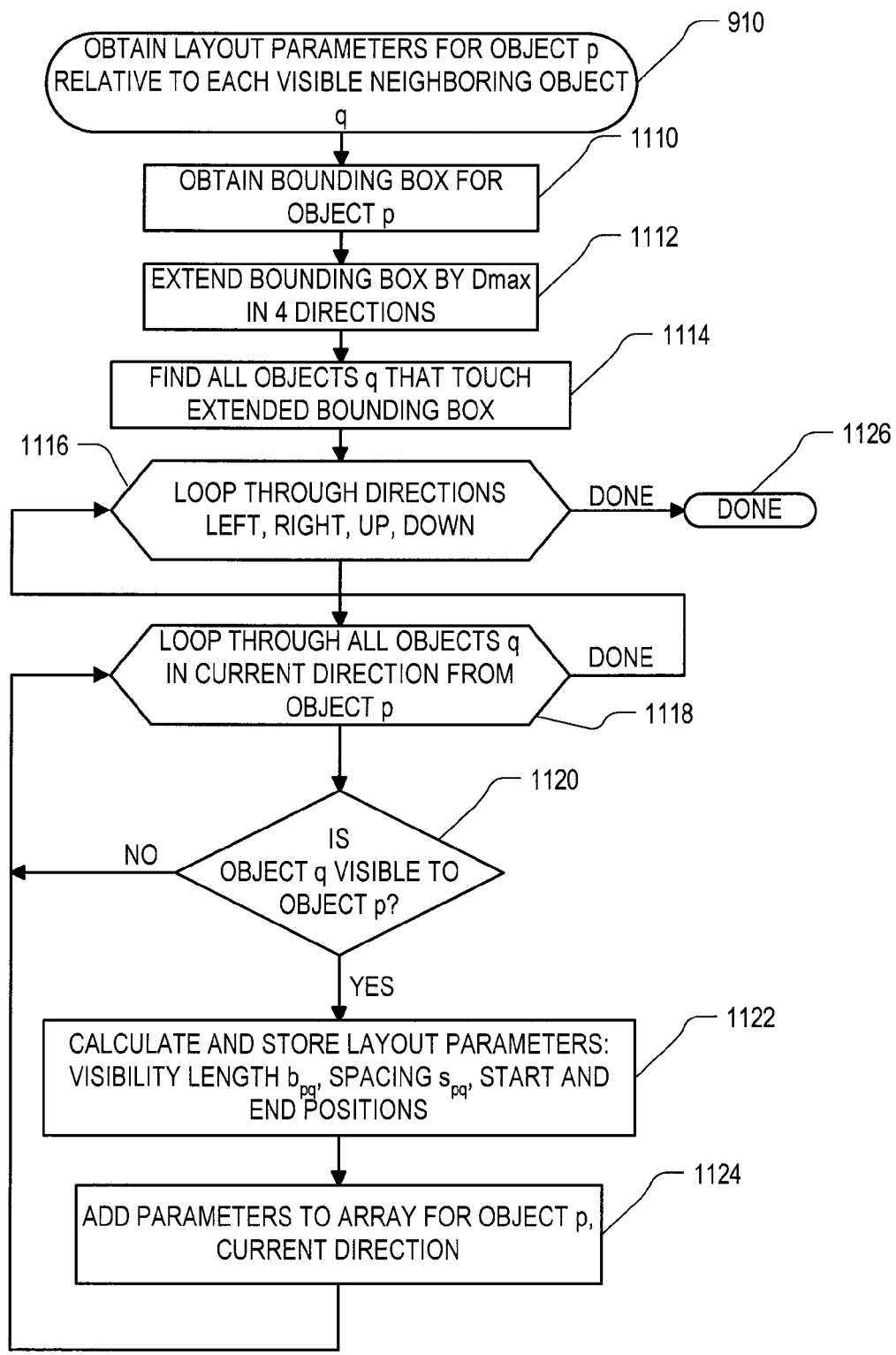

FIG. 11 is a flowchart detail of step 910, for obtaining layout parameters for object p relative to each visible neighboring object q. In step 1110, the routine first determines a bounding box for object p. This might involve, for example, determining the minimum and maximum x and y locations of the object. In step 1112, the bounding box is extended by the maximum defect size of interest, $D_{max}$, in all four directions. It is not necessary to consider neighboring objects beyond that distance, since no defect of any size of interest can overlap both the current object and the object outside the extended bounding box simultaneously to thereby create a short circuit. In step 1114, all objects q that touch the extended bounding box are identified. Four arrays are created and associated with object p. One array identifies all the objects q in a rightward direction from object p; a second array identifies all the objects q in a leftward direction from object p; a third array identifies all the objects q in an upward direction from object p; and a fourth array identifies all the objects q in a downward direction from object P.

In step 1116, the routine loops through all four directions left, right, up and down. In step 1118, the routine loops through all objects q that are located in the current direction (left, right, up or down) from the current object p. In step 1120, it is determined whether object q is "visible" to object p, as that term is defined elsewhere herein. If not, then control returns to the looping step 1118 to consider the next object q in the current direction.

If object q is visible to object p, then in step 1122, the routine calculates and stores the layout parameters for object p relative to object q. In the present embodiment, such layout parameters include the visibility length $b_{pq}$, the spacing $s_{pq}$, the width of each object $w_p$, $w_q$, the starting position (x or y, for vertically and horizontally neighboring objects q, respectively) of the portion of object p from which object q is visible, and the ending position (x or y) of the portion of object p from which object q is visible. In step 1124, the layout parameters extracted in step 1122 are added to an array for object p for the current direction.

Control then returns to looping step 1118 to consider the next object q in the current direction from object p. If there are no more objects q in the current direction from object p, then control returns to looping step 1116 to consider the next direction. After all four directions have been considered, then in step 1126 the routine exits. At the end of step 1126 (i.e. at the end of step 910), object p has associated therewith four arrays: one for neighboring objects q in each of the four directions. Each entry in each array identifies for the object pair (p,q) the following layout parameters: $b_{pq}$, $s_{pq}$, $w_q$, the starting position (x or y) of the portion of object p from which object q is visible, and the ending position (x or y) of the portion of object p from which object q is visible. The width $w_p$ is stored only once for each array, and will be the size of object p in the horizontal dimension for the left and right arrays, or the size of object p in the vertical dimension for the up and down arrays.

Figure 12:
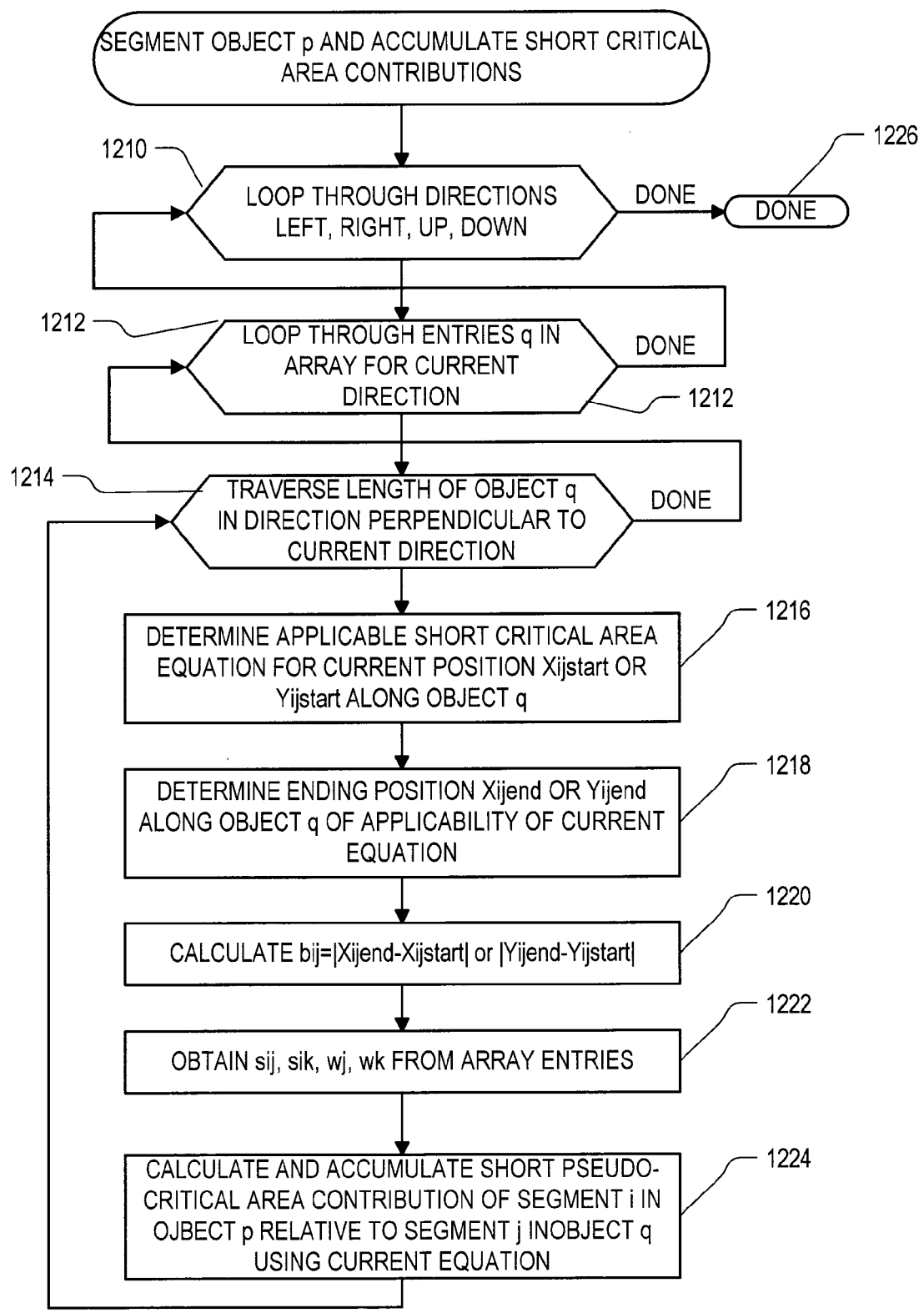

Returning to FIG. 9, after step 910, step 912 first segments the object p at equation applicability condition boundaries, possibly creating a sub-array of entries for each object pair (p,q). Step 914 then calculates and accumulates both the short and open average critical area contributions for each segment identified in the sub-arrays. In an embodiment, however, these steps are re-organized so that the average short and open critical area contributions are calculated separately, but the segmentation and calculation steps for each individual one of these defect types are combined together into a single method. FIG. 12 is a flowchart illustrating a combined segmentation and calculation method for the average short critical area calculation. In the method of FIG. 12, the average short critical area contributions of the various object segments are calculated promptly as each segment is identified. No sub-arrays need be formed unless required in the particular embodiment for other reasons.

Figure 13:
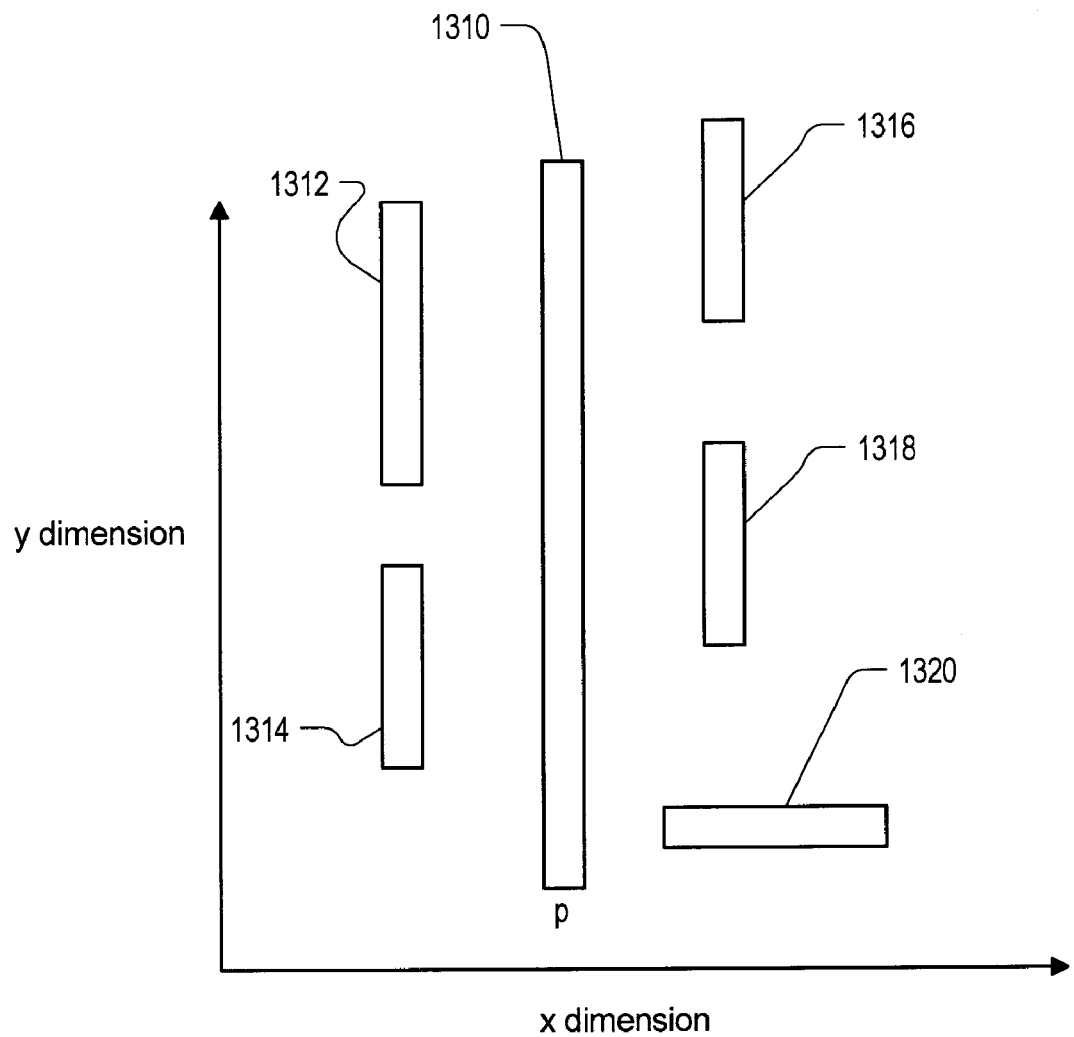

FIG. 12 will be described with respect to an example vertical object p (1310) in the layout example of FIG. 13. In this layout example, two objects 1312 and 1314 are disposed leftward from object p, at distinct vertical positions along the length of object p. Three additional objects 1316, 1318 and 1320 are disposed rightward from object p, also at distinct vertical positions along the length of object p. Object p's left array therefore contains two entries whereas its right array contains three entries. In this example, no objects neighbor object p in the upward or downward directions, so the up and down arrays for object p are empty. Object 1320 is shown oriented horizontally in order to emphasize that the method of FIG. 9 makes no distinction based on the orientation of neighboring objects.

Referring to FIG. 12, in step 1210, the routine first loops through the four directions, leftward, rightward, upward and downward. The first direction in the present illustration will be leftward. In step 1212, the routine loops through all entries q in the array for the current direction. The left array in the current illustration contains two entries, one each for neighboring objects 1312 and 1314. In step 1214, the routine then traverses the length of object q in the dimension perpendicular to the current direction. For object 1312, for example, step 1214 traverses object 1312 vertically.

As the current object q is traversed, in step 1216, the routine examines the layout parameters in the current array entry, as well as those in the array for the direction opposite the current direction (the array for the rightward direction, during this first direction iteration), in order to determine which short pseudo-critical area equation (24), (25), (26) or (27) applies at the beginning of the current segment i. For purposes of this determination, the current position along the length of the current object p is the start of an object segment i, the current position along the length of the current object q is the start of an object segment j, and the current position along the length of an object (if any) visible in the direction opposite the current direction is the start of an object segment k. The starting position $x_{ijstart}$ or $y_{ijstart}$ is noted.

In step 1218, the routine again examines the layout parameters to identify the ending position along the object q beyond which the equation determined in step 1216 no longer applies. If the equation applicable to the current segment i is an equation applicable only where there is only one visible neighboring object segment, then the ending position is the x or y position at which the current object p or q ends, or a new object begins in the direction opposite the current direction, whichever is first. If the equation applicable to the current segment i is an equation applicable only where there are visible neighboring object segments on both sides, then the ending position is the x or y position at which the current object p or q ends, or the current object in the direction opposite the current direction ends, whichever is first. In any case, the ending position $x_{ijend}$ or $y_{ijend}$ is noted.

In step 1220 the parameter $b_{ij}$ is now calculated as $|x_{ijend} - x_{ijstart}|$ or $|y_{ijend} - y_{ijstart}|$ as the case may be. In step 1222, the parameters $s_{ij}$ and if applicable, $s_{ik}$ and $w_k$ are obtained from the array entries. $w_i$ is known from the width $w_p$ of the current object p. All the parameters are now available to calculate the average short pseudo-critical area contribution of object segment i in object p relative to segment j in object q using the currently applicable equation. This is done in step 1224, and the contribution is accumulated into the overall average short critical area value being calculated. Control then returns to traversing step 1214 to identify the next object segment i on object p relative to neighboring object q, and to calculate and accumulate its short critical area contribution.

If the traversal of step 1214 has reached the end of the current object q, then control returns to looping step 1212 to consider the next entry q in the array for the current direction. If there are no more entries in such array (i.e. after consideration of both objects 1312 and 1314 in the example of FIG. 13), then control returns to step 1210 to consider the array for the next direction relative to object p. In the example of FIG. 13, this iteration will consider the critical area contributions of each segment i along the length of object p relative to each of the objects 1316, 1318 and 1320 in the array for the rightward direction relative to object p. Once the arrays for all four directions relative to object p have been exhausted, the total average short pseudo-critical area contribution of object p will have been accumulated.

In order to further remove redundancy in visiting all four directions, FIG. 12 can be applied after the left and right directions are finished for step 1116 in FIG. 11. That is, after finishing steps 1118-1124 in FIG. 11 for both the left and right directions, steps 1212-1224 in FIG. 12 are applied for these two directions. Steps 1118-1124 in FIG. 11 are then applied for both the top and bottom directions, followed by performing steps 1212-1224 in FIG. 12 for the top and bottom directions.

Figure 14:
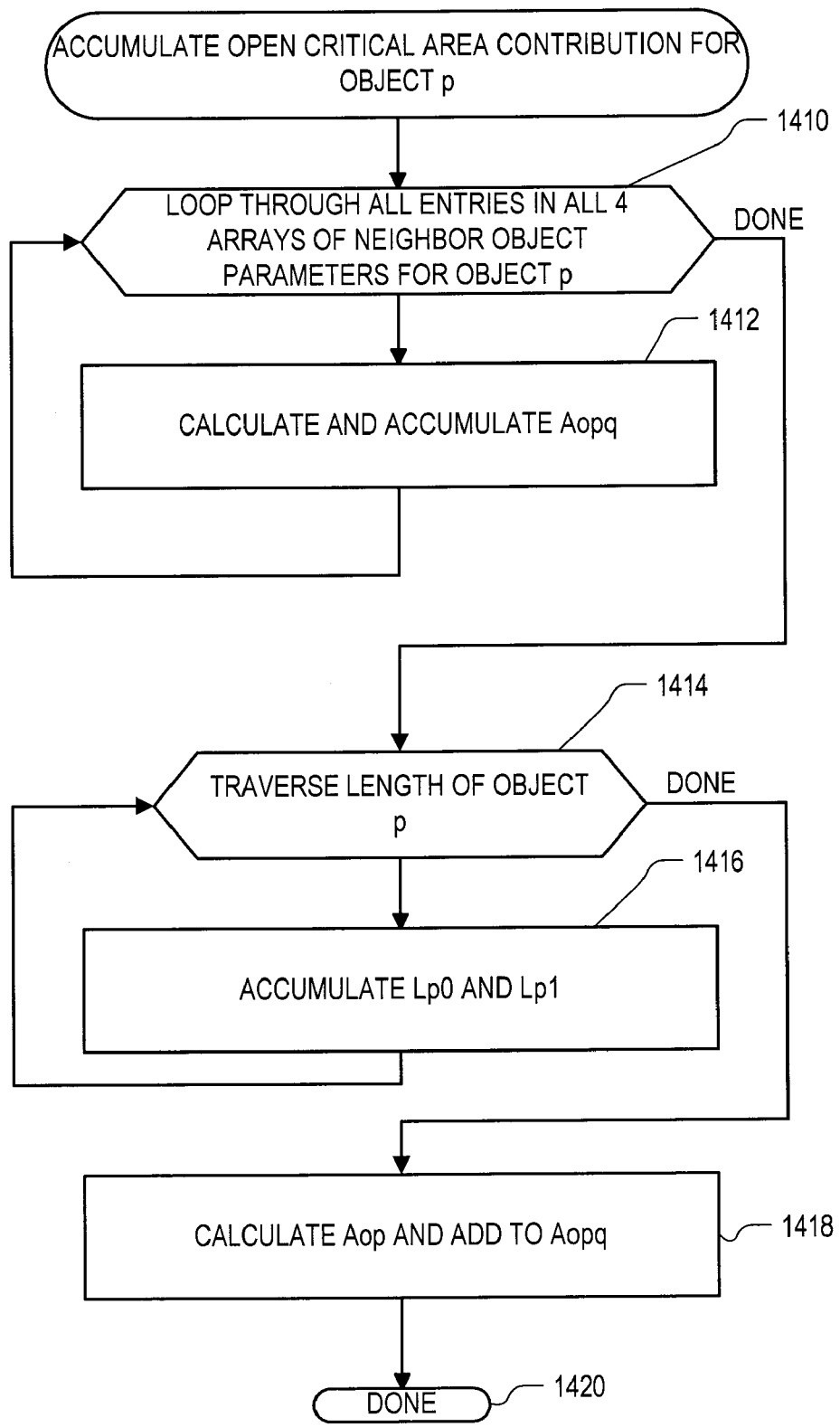

For the average open critical area contribution of object p, if equations having distinct applicability conditions were derived in step 310, then a routine similar to that of FIG. 12 could be used. In the present embodiment, though, all such equations were combined into a single equation (36) above, which does not require segmentation. The calculation of the open pseudo-critical area contribution of object p therefore requires no more than the extraction of the parameters $w_p$, $w_q$, $l_p$, $l_{p0}$, $l_{p1}$, and $b_{pq}$ and $s_{pq}$ for each neighboring object q. FIG. 14 is a flowchart illustrating one method for performing the calculation.

In step 1410 of FIG. 14, the routine first loops through all entries of neighboring object q in all four arrays associated with the current object p. In step 1412, $A_{opq}$ is calculated according to equation (41) and accumulated. Control then returns to looping step 1410 to consider the next neighboring object q.

After all the $A_{opq}$'s have been summed, then in step 1414, the routine begins a new loop to traverse the length of object p. In step 1416, values for $l_{p0}$ and $l_{p1}$ are accumulated during this traversal. The routine then returns to step 1414 to continue the traversal. The value for $l_p$ need not be accumulated during this traversal because it is trivially available from the starting and ending positions (x or y) of object p.

In step 1418, after $l_p$, $l_{p0}$ and $l_{p1}$ are available, the routine calculates $A_{op}$ using equation (40) and adds it to $A_{opq}$ calculated in steps 1410 and 1412. In step 1420, the routine exits with the average open pseudo-critical area contribution due to object p.

As previously mentioned with respect to FIG. 8, after the average short and open pseudo-critical area contributions of object p have been determined, they are added to respective sums to accumulate the total average open critical area over all objects and defect sizes of interest.

The above-described embodiments make certain assumptions and simplifications which may slightly degrade the accuracy of the overall critical area calculation. For example, the above-described embodiments assume that all objects of interest are rectangular, and all contamination particles are discs. The embodiments also assume that a short defect cannot exist between two objects if they do not overlap in either the vertical or horizontal dimension, a simplification that may not be valid where the two objects are offset in one dimension only slightly. Different equations or methods can be derived that do not make such simplifications, and those equations or methods may be more precise where the assumptions of the embodiments described herein are not completely valid. On the other hand, equations can also be derived that make additional simplifications that are not made in the above-described embodiments, and the average critical area calculations from such equations may in that sense be correspondingly less precise. For example, one embodiment might consider only the nearest visible neighbor j, instead of all visible neighbors. Another embodiment might consider only the neighbor(s) with the most significant impact, if that can be determined economically.

In general, the equations used herein need only determine the critical area approximately, to a level of precision that is required for the user's purpose. As one example, the pseudo-critical area regions at each defect size of interest might be assigned to the individual object segments in only "substantially" (to desired level of precision) non-overlapping manner. While exactness would be desirable, it is usually unnecessary and even with the techniques described herein it may require more computation time and effort than appropriate for the user's particular purpose. Nevertheless, the techniques described herein permit much more exact critical area computations with far less computation time and effort than required by conventional methods. As used herein, exactness and precision are included in, and considered special cases of, estimation and approximation. That is, a formula that estimates or approximates a value may actually determine the value exactly, and a formula that determines a value exactly is still considered to "approximate" or "estimate" the value.

Use of Short Pseudo-Critical Area Techniques for Guiding Layout Optimization

As described above with respect to FIG. 3, after the average critical area $A_{cr}$ over the layout objects of interest is calculated in step 312, one of the purposes for which it can be used is as part of a cost function to optimize the yield for a routed design. In the past, most approaches for post-routing yield optimization fell into either of two main categories. In one category, the critical area at one particular defect size was used for determining the new position of an object. (In this section, the term "object" is used generally. It need not extend all the way from one corner to another, nor need it be limited in length by equation applicability conditions.) This solution was inadequate because an optimization tuned for one specific defect size is not necessarily optimal for all defect sizes. In fact, it can be shown that the optimal location for an object for minimizing the local critical area is different for different defect sizes, and quite often in opposing directions. In the second category, the object in question was moved incrementally and iteratively until no further improvement in the average critical area is observed. This solution was inadequate because prior art methods of critical area computation have been inaccurate or extremely expensive or both, as described above.

Having an explicit formulation for average critical area as derived above, permits direct calculation of the optimal location for a group of one or more objects for minimizing the local critical area. This is an improvement over most previous approaches for incremental post-route layout optimization. It is more accurate than the approach that computes the optimal position based on only one defect size, and it can be far less expensive than the repeated move-evaluate approach. The approach described herein avoids these move-evaluate iterations and hence is less computationally expensive.

For simplicity of presenting the post-routing yield optimization algorithm, we use the scheme of moving one object at a time as an illustrative example. For that purpose, we derive an explicit formula for the optimal location of an object that minimizes the local average short critical area. One embodiment can impose a requirement that the movement of objects not alter the predefined routing topology (i.e. that the optimization does not allow movement of an object so that it overlaps or moves beyond any other object of interest), whereas another embodiment has no such requirement.

An object's optimal position depends on its position relative to all its visible neighbors. In the present embodiment, the critical area of that neighborhood is formulated for the target object to be moved, not the pseudo-critical area. The main reason is that pseudo-critical area is formulated for the purpose of calculating the total actual critical area. In order to formulate the total critical area as summation of the pseudo-critical areas, the definition of the pseudo-critical area for one particular object i includes only part of the actual critical area for object pair (i,j); the remaining part is included in the pseudo-critical area for object j. For layout optimization, it is only necessary to formulate the critical area for the objects being moved and their visible neighbors. In the scheme being described here, only one object is moved at a time. Hence, only the evaluation of the critical area contributed by the object pairs between the target object with its visible neighbors is needed. There is no need to evaluate the critical areas contributed by the target object's neighbors with their own neighbors. We also carefully handle the possible overlaps among the critical areas contributed by the different object pairs between the target object with its visible neighbors. The formulae are shown by equations (42) and (43) below.

Purely for the purpose of simplicity in an illustration of how a method according to this technique works, we now apply some simplifying assumptions in order to derive equations (42) and (43): $D_{max}$ is assumed to be infinite, and we consider only the short critical area (not the open critical area). Other embodiments may not make these same assumptions. The exact formulation can be derived following the similar idea but requires extra bookkeeping.

The critical area between the target object i and all its left side visible neighbors is formulated in (42). The critical area between the target object i and all its right side visible neighbors is formulated in (43).

$$A_{cr}(i)_{left} = \sum_{left-nbr-j} \frac{b_{ij}}{2s_{ij}} - \frac{b_{ij}}{4(2s_{ij}+w_j)} - \sum_{\substack{segments\ of\ j \\ with\ 2-side\ nbrs}} \frac{b_{ijk}}{4(s_{ij}+s_{ik}+w_i)}. \quad (42)$$

$$A_{cr}(i)_{right} = \sum_{right-nbr-k} \frac{b_{ik}}{2s_{ik}} - \frac{b_{ik}}{4(2s_{ik}+w_k)} - \sum_{\substack{segments\ of\ i \\ with\ 2-side\ nbrs}} \frac{b_{ijk}}{4(s_{ij}+s_{ik}+w_i)}. \quad (43)$$

In these equations, $b_{ij}$ is the total length of object i that is visible to one of its left side visible neighbors. $b_{ik}$ is the total length of object i that is visible to one of its right side visible neighbors, and $b_{ijk}$ is the total length of the segment of object i that has visible neighbors on both sides.

The optimal location for object i, therefore, given the above simplifications and assumptions, is the value $s_{ij}^*$ that minimizes the sum of the average critical area on the left and the average critical area on the right of the object. That is:

$$s_{ij}^* = \min_{s}[A_{cr}(i)_{left} + A_{cr}(i)_{right}]. \quad (44)$$

If equations (42) and (43) are further approximated by replacing the summation with only the one neighbor that contributes the most critical area on that side (or with the nearest visible neighbor on that side), and by assuming the same wire width for all the objects, then we can derive the optimal position for object i explicitly:

$$s_{ij}^* = \frac{1}{1+\sqrt{\frac{b_{ik}}{b_{ij}}}}. \quad (45)$$

Now that an explicit formula has been derived for the optimal position of an object i, the following describes the basic flow of a post-routing optimization algorithm. Reference will be made to the example layout region shown in FIG. 15, which shows an object 1510 under consideration, and left- and right-hand objects 1512 and 1514, respectively. The initial horizontal position of object segment 1510 is shown as 1510a, and the final position, as optimized by the method below, is shown as 1510b. Two other objects 1516 and 1518, nominally upward and downward from the object segment 1510 under consideration, provide restrictions on the segment of object 1510 that can be moved.

The embodiment described herein focuses on a single layer at a time and so vias are not touched. Hence, the only movable objects on a layer are the wires. Typically, in routing, each layer has a preferred direction of routing, either horizontal or vertical. Since the majority of the wires on a layer are in the preferred direction, the direction of movement is chosen to be perpendicular to the preferred direction on that layer. Furthermore, only the wires along the preferred direction are candidates for moving in the present embodiment. For clarity of explanation, the present description assumes that the preferred direction in the current layer under consideration is vertical. The algorithm then is as follows:

First, for each vertical object in the layer, the difference between the critical areas on both sides is computed. This difference is referred to herein as the optimization potential.

Second, the algorithm identifies the object having the largest optimization potential, and shifts it to the optimal location computed using eq. (45).

Third, the optimization potentials of the visible neighbors of the shifted object are recomputed (as their visible neighbors have changed), and the second step is repeated until all the movable objects have been processed once.

Note that once an object is shifted to the optimal location, it is locked and is not re-visited for the remainder of the iteration. Since the optimal location of an object segment as computed in Eq. (45) depends of the positions of the visible neighbors, it may help to run several iterations of the above algorithm to take these modifications into account.

In order to shift the object segment to an optimal position (the second step in the algorithm above) without violating any design rules, the following two steps should be done efficiently:

Spacing-visible neighbors: Find all the objects that are visible to the object being moved, modulo the spacing rules. We call these the "spacing-visible" neighbors to differentiate from the visible neighbors used in the critical area computation. The spacing-visible neighbors of all the movable objects in the layout are computed in one sweep through the layout. An efficient variant of the algorithm outlined in J. Fang, et. al., "A new fast constraint graph generation algorithm for VLSI layout compaction", in IEEE International Symposium on Circuits and Systems, 1991, incorporated by reference herein, is used for the purpose.

Figure 15:
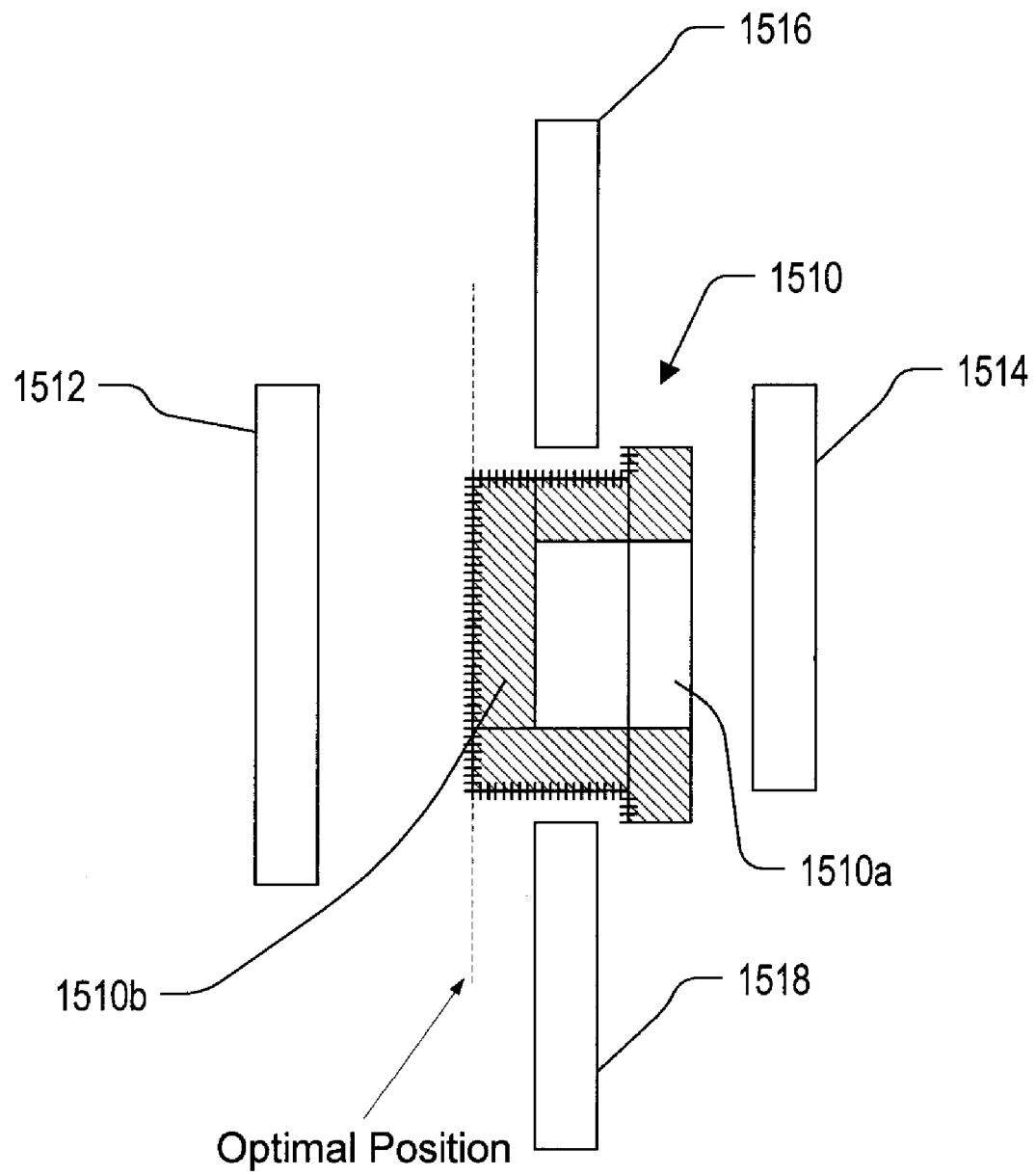
FIG. 15 illustrates the positions of the wires in a layout before and after layout optimization.

Wire-pushing: Given the spacing-visible neighbors and the optimal position, push the object segment to the specified optimal location. As shown in FIG. 15, in the basic idea of wire pushing, the original object segment is replaced by a set of horizontal and vertical objects such that most of the original object segment is now located at the calculated optimal position, while obeying the spacing rules of the given layer. The actual pushing algorithm is a modification of the well-known skyline algorithm described in Udi Manber, "Introduction to Algorithms, A Creative Approach", Addison-Wesley Publishing Co., 1989, at pp. 102-104. The entire Manber book is incorporated by reference herein.

Figure 16:
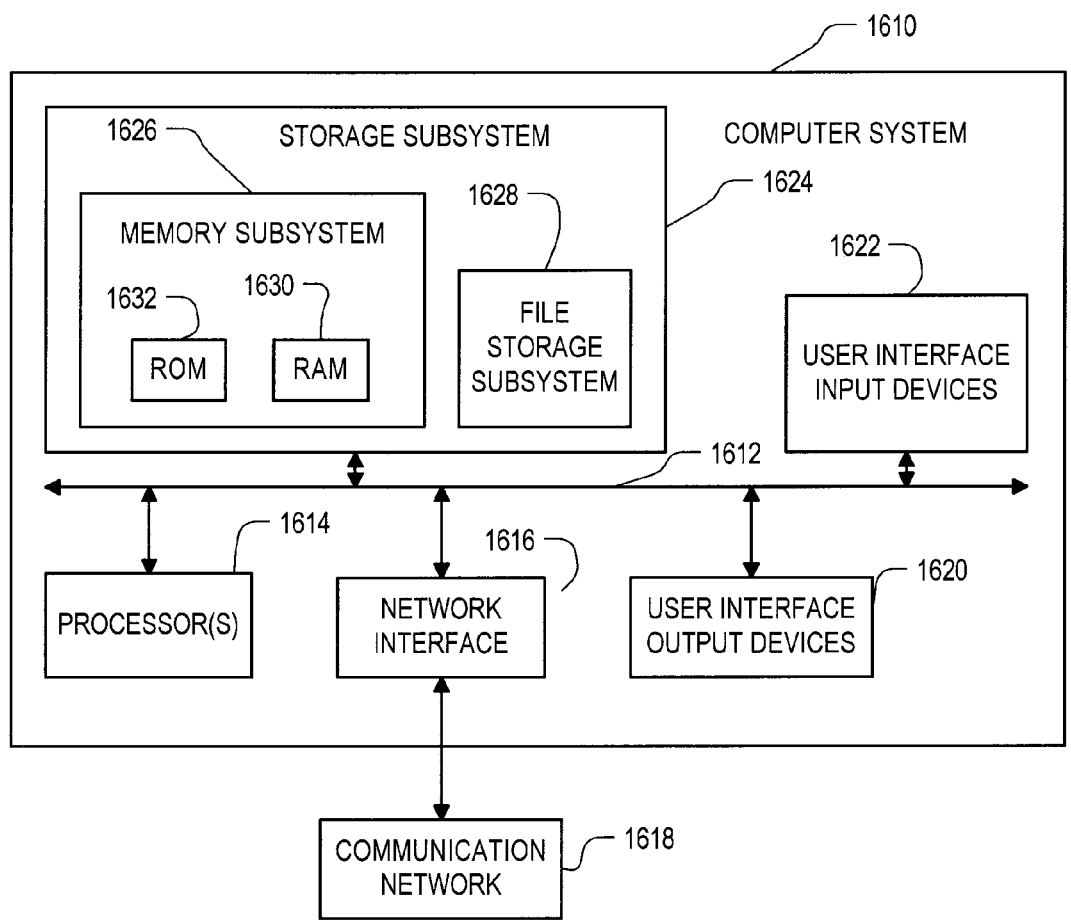
FIG. 16 is a simplified block diagram of a computer system suitable for use with embodiments of the present invention.

FIG. 16 is a simplified block diagram of a computer system 1610 on which embodiments of the present invention can be executed. Computer system 1610 typically includes at least one processor 1614 which communicates with a number of peripheral devices via bus subsystem 1612. These peripheral devices may include a storage subsystem 1624, comprising a memory subsystem 1626 and a file storage subsystem 1628, user interface input devices 1622, user interface output devices 1620, and a network interface subsystem 1616. The input and output devices allow user interaction with computer system 1610. Network interface subsystem 1616 provides an interface to outside networks, including an interface to communication network 1618, and is coupled via communication network 1618 to corresponding interface devices in other computer systems. Communication network 1618 may comprise many interconnected computer systems and communication links. These communication links may be wireline links, optical links, wireless links, or any other mechanisms for communication of information. While in one embodiment, communication network 1618 is the Internet, in other embodiments, communication network 1618 may be any suitable computer network.

User interface input devices 1622 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 1610 or onto computer network 1618.

User interface output devices 1620 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 1610 to the user or to another machine or computer system.

Storage subsystem 1624 stores the basic programming and data constructs that provide the functionality of certain embodiments of the present invention. For example, the various modules implementing the functionality of certain embodiments of the invention may be stored in storage subsystem 1624. These software modules are generally executed by processor 1614.

Memory subsystem 1626 typically includes a number of memories including a main random access memory (RAM) 1630 for storage of instructions and data during program execution and a read only memory (ROM) 1632 in which fixed instructions are stored. File storage subsystem 1628 provides persistent storage for program and data files, and may include a hard disk drive, a floppy disk drive along with associated removable media, a CD-ROM drive, an optical drive, or removable media cartridges. The databases and modules implementing the functionality of certain embodiments of the invention may be stored by file storage subsystem 1628.

Bus subsystem 1612 provides a mechanism for letting the various components and subsystems of computer system 1610 communicate with each other as intended. Although bus subsystem 1612 is shown schematically as a single bus, alternative embodiments of the bus subsystem may use multiple busses.

Computer system 1610 itself can be of varying types including a personal computer, a portable computer, a workstation, a computer terminal, a network computer, a television, a mainframe, or any other data processing system or user device. Due to the ever-changing nature of computers and networks, the description of computer system 1610 depicted in FIG. 16 is intended only as a specific example for purposes of illustrating the preferred embodiments of the present invention. Many other configurations of computer system 1610 are possible having more or less components than the computer system depicted in FIG. 16.

As used herein, a given value is "responsive" to a predecessor value if the predecessor value influenced the given value. If there is an intervening processing step, the given value can still be "responsive" to the predecessor value. If the intervening processing step combines more than one value, the output of the processing step is considered "responsive" to each of the value inputs. If the given value is the same as the predecessor value, this is merely a degenerate case in which the given value is still considered to be "responsive" to the predecessor value. "Dependency" of a given value upon another value is defined similarly. Also, a second value is considered herein to be "independent" of a first value if the first value is not referenced in the calculation of the second value.

As used herein, the "identification" of an item of information does not necessarily require the direct specification of that item of information. Information can be "identified" in a field by simply referring to the actual information through one or more layers of indirection, or by identifying one or more items of different information which are together sufficient to determine the actual item of information. In addition, the term "indicate" is used herein to mean the same as "identify".

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference in the Background section of this patent application are specifically incorporated by reference into the description herein of embodiments of the invention. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A method for post-route optimization of a position in a particular dimension, of a first group of at least one object in an integrated circuit layout layer, comprising the steps of:

using a computer system to calculate, using an explicit formula, an optimal position for the first group of objects in the particular dimension, the optimal position being a position in the particular dimension that minimizes a sum of the average critical area on both sides of the first group of objects which are opposite each other in the particular dimension; and moving the first group of objects in the layer to the calculated position along the particular dimension.

2. A method according to claim 1, wherein the first group of objects consists of a single object.

3. A method according to claim 2, wherein the single object has second and third neighboring objects on respectively opposite sides of the single object in the layer, and wherein the explicit formula calculates the optimal position for the single object as having approximately a spacing $s_{ij}^*$ from the second neighboring object given by:

$$s_{ij}^* = \frac{1}{1+\sqrt{\frac{b_{ik}}{b_{ij}}}},$$

where $b_{ij}$ is the mutual visibility length of the single object relative to the second neighboring object, and $b_{ik}$ is the mutual visibility length of the single object relative to the third neighboring object.

4. A method according to claim 1, wherein the explicit formula is defined so as to retain the routing topology of the layer.

5. A method according to claim 1, wherein the explicit formula is representative of a plurality of defect sizes.

6. Apparatus for post-route optimization of a position in a particular dimension, of a first group of at least one object in an integrated circuit layout layer, comprising:

means for calculating, using an explicit formula, an optimal position for the first group of objects in the particular dimension, the optimal position being a position in the particular dimension that minimizes a sum of the average critical area on both sides of the first group of objects which are opposite each other in the particular dimension; and means for moving the first group of objects in the layer to the calculated position along the particular dimension.

7. Apparatus according to claim 6, wherein the first group of objects consists of a single object.

8. Apparatus according to claim 7, wherein the explicit formula is defined so as to retain the routing topology of the layer.

9. Apparatus according to claim 6, wherein the explicit formula is representative of a plurality of defect sizes.

10. A system for post-route optimization of a position in a particular dimension, of a first group of at least one object in an integrated circuit layout layer, the system comprising a memory and a data processor coupled to the memory, the data processor configured to:

calculate, using an explicit formula, an optimal position for the first group of objects in the particular dimension, the optimal position being a position in the particular dimension that minimizes a sum of the average critical area on both sides of the first group of objects which are opposite each other in the particular dimension; and move the first group of objects in the layer to the calculated position along the particular dimension.

11. A system according to claim 10, wherein the first group of objects consists of a single object.

12. A system according to claim 11, wherein the single object has second and third neighboring objects on respectively opposite sides of the single object in the layer, and wherein the explicit formula calculates the optimal position for the single object as having approximately a spacing $s_{ij}^*$ from the second neighboring object given by:

$$s_{ij}^* = \frac{1}{1+\sqrt{\frac{b_{ik}}{b_{ij}}}},$$

where $b_{ij}$ is the mutual visibility length of the single object relative to the second neighboring object, and $b_{ik}$ is the mutual visibility length of the single object relative to the third neighboring object.

13. A system according to claim 10, wherein the explicit formula is defined so as to retain the routing topology of the layer.

14. A system according to claim 10, wherein the explicit formula is representative of a plurality of defect sizes.

* * * * *